United States Patent
Resch et al.

(10) Patent No.: US 8,843,804 B2
(45) Date of Patent: Sep. 23, 2014

(54) ADJUSTING A DISPERSAL PARAMETER OF DISPERSEDLY STORED DATA

(75) Inventors: Jason K. Resch, Chicago, IL (US); Gary W. Grube, Barrington Hills, IL (US); Timothy W. Markison, Mesa, AZ (US)

(73) Assignee: Cleversafe, Inc., Chicago, IL (US)

( * ) Notice: Subject to any disclaimer, the term of this patent is extended or adjusted under 35 U.S.C. 154(b) by 235 days.

(21) Appl. No.: 13/413,452

(22) Filed: Mar. 6, 2012

(65) Prior Publication Data

US 2012/0254691 A1 Oct. 4, 2012

Related U.S. Application Data

(60) Provisional application No. 61/470,521, filed on Apr. 1, 2011.

(51) Int. Cl.
| | |
|---|---|
| *G11C 29/42* | (2006.01) |
| *H03M 13/27* | (2006.01) |
| *G06F 11/10* | (2006.01) |
| *G11C 29/54* | (2006.01) |
| *H03M 13/15* | (2006.01) |
| *H03M 13/23* | (2006.01) |
| *H03M 13/09* | (2006.01) |

(52) U.S. Cl.
CPC ....... *G06F 11/1044* (2013.01); *H03M 13/2707* (2013.01); *H03M 13/1515* (2013.01); *G06F 11/1076* (2013.01); *H03M 13/23* (2013.01); *H03M 13/09* (2013.01)
USPC .......................................... 714/763; 714/718

(58) Field of Classification Search
CPC ........... G06F 11/1044; G06F 11/1076; H03M 13/09; H03M 13/1515; H03M 13/23; H03M 13/2707
See application file for complete search history.

(56) References Cited

U.S. PATENT DOCUMENTS

| | | |
|---|---|---|
| 4,092,732 A | 5/1978 | Ouchi |
| 5,454,101 A | 9/1995 | Mackay et al. |
| 5,485,474 A | 1/1996 | Rabin |
| 5,774,643 A | 6/1998 | Lubbers et al. |
| 5,802,364 A | 9/1998 | Senator et al. |
| 5,809,285 A | 9/1998 | Hilland |
| 5,890,156 A | 3/1999 | Rekieta et al. |
| 5,987,622 A | 11/1999 | Lo Verso et al. |
| 5,991,414 A | 11/1999 | Garay et al. |
| 6,012,159 A | 1/2000 | Fischer et al. |

(Continued)

OTHER PUBLICATIONS

Shamir; How to Share a Secret; Communications of the ACM; vol. 22, No. 11; Nov. 1979; pp. 612-613.

(Continued)

*Primary Examiner* — Guerrier Merant
*Assistant Examiner* — Dipakkumar Gandhi
(74) *Attorney, Agent, or Firm* — Garlick & Markison; Timothy W. Markison

(57) ABSTRACT

A method begins by a processing module storing data files utilizing a dispersed storage error coding function that includes a pillar width parameter and a decode threshold parameter. The method continues with the processing module determining whether to adjust the pillar width parameter based one or more memory performance characteristics. When the pillar width parameter is to be decreased, the method continues with the processing module identifying one or more pillars within a memory to delete to produce one or more identified pillars, identifying encoded data slices of one or more of the data files stored in the one or more identified pillars to produce identified encoded data slices, and deleting the identified encoded data slices.

24 Claims, 19 Drawing Sheets

(56) References Cited

U.S. PATENT DOCUMENTS

| | | | |
|---|---|---|---|
| 6,058,454 | A | 5/2000 | Gerlach et al. |
| 6,128,277 | A | 10/2000 | Bruck et al. |
| 6,175,571 | B1 | 1/2001 | Haddock et al. |
| 6,192,472 | B1 | 2/2001 | Garay et al. |
| 6,256,688 | B1 | 7/2001 | Suetaka et al. |
| 6,272,658 | B1 | 8/2001 | Steele et al. |
| 6,301,604 | B1 | 10/2001 | Nojima |
| 6,356,949 | B1 | 3/2002 | Katsandres et al. |
| 6,366,995 | B1 | 4/2002 | Vilkov et al. |
| 6,374,336 | B1 | 4/2002 | Peters et al. |
| 6,415,373 | B1 | 7/2002 | Peters et al. |
| 6,418,539 | B1 | 7/2002 | Walker |
| 6,449,688 | B1 | 9/2002 | Peters et al. |
| 6,567,948 | B2 | 5/2003 | Steele et al. |
| 6,571,282 | B1 | 5/2003 | Bowman-Amuah |
| 6,609,223 | B1 | 8/2003 | Wolfgang |
| 6,718,361 | B1 | 4/2004 | Basani et al. |
| 6,760,808 | B2 | 7/2004 | Peters et al. |
| 6,785,768 | B2 | 8/2004 | Peters et al. |
| 6,785,783 | B2 | 8/2004 | Buckland |
| 6,826,711 | B2 | 11/2004 | Moulton et al. |
| 6,879,596 | B1 | 4/2005 | Dooply |
| 7,003,688 | B1 | 2/2006 | Pittelkow et al. |
| 7,024,451 | B2 | 4/2006 | Jorgenson |
| 7,024,609 | B2 | 4/2006 | Wolfgang et al. |
| 7,080,101 | B1 | 7/2006 | Watson et al. |
| 7,103,824 | B2 | 9/2006 | Halford |
| 7,103,915 | B2 | 9/2006 | Redlich et al. |
| 7,111,115 | B2 | 9/2006 | Peters et al. |
| 7,140,044 | B2 | 11/2006 | Redlich et al. |
| 7,146,644 | B2 | 12/2006 | Redlich et al. |
| 7,171,493 | B2 | 1/2007 | Shu et al. |
| 7,222,133 | B1 | 5/2007 | Raipurkar et al. |
| 7,240,236 | B2 | 7/2007 | Cutts et al. |
| 7,272,613 | B2 | 9/2007 | Sim et al. |
| 7,636,724 | B2 | 12/2009 | de la Torre et al. |
| 2002/0062422 | A1 | 5/2002 | Butterworth et al. |
| 2002/0166079 | A1 | 11/2002 | Ulrich et al. |
| 2003/0018927 | A1 | 1/2003 | Gadir et al. |
| 2003/0037261 | A1 | 2/2003 | Meffert et al. |
| 2003/0065617 | A1 | 4/2003 | Watkins et al. |
| 2003/0084020 | A1 | 5/2003 | Shu |
| 2004/0024963 | A1 | 2/2004 | Talagala et al. |
| 2004/0122917 | A1 | 6/2004 | Menon et al. |
| 2004/0215998 | A1 | 10/2004 | Buxton et al. |
| 2004/0228493 | A1 | 11/2004 | Ma et al. |
| 2005/0100022 | A1 | 5/2005 | Ramprashad |
| 2005/0114594 | A1 | 5/2005 | Corbett et al. |
| 2005/0125593 | A1 | 6/2005 | Karpoff et al. |
| 2005/0131993 | A1 | 6/2005 | Fatula, Jr. |
| 2005/0132070 | A1 | 6/2005 | Redlich et al. |
| 2005/0144382 | A1 | 6/2005 | Schmisseur |
| 2005/0229069 | A1 | 10/2005 | Hassner |
| 2006/0047907 | A1 | 3/2006 | Shiga et al. |
| 2006/0136448 | A1 | 6/2006 | Cialini et al. |
| 2006/0156059 | A1 | 7/2006 | Kitamura |
| 2006/0224603 | A1 | 10/2006 | Correll, Jr. |
| 2007/0079081 | A1 | 4/2007 | Gladwin et al. |
| 2007/0079082 | A1 | 4/2007 | Gladwin et al. |
| 2007/0079083 | A1 | 4/2007 | Gladwin et al. |
| 2007/0088970 | A1 | 4/2007 | Buxton et al. |
| 2007/0174192 | A1 | 7/2007 | Gladwin et al. |
| 2007/0214285 | A1 | 9/2007 | Au et al. |
| 2007/0234110 | A1 | 10/2007 | Soran et al. |
| 2007/0283167 | A1 | 12/2007 | Venters, III et al. |
| 2009/0094251 | A1 | 4/2009 | Gladwin et al. |
| 2009/0094318 | A1 | 4/2009 | Gladwin et al. |
| 2010/0023524 | A1 | 1/2010 | Gladwin et al. |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): String Representation of Distinguished Names; IETF Network Working Group; RFC 4514; Jun. 2006; pp. 1-15.

Sermersheim; Lightweight Directory Access Protocol (LDAP): The Protocol; IETF Network Working Group; RFC 4511; Jun. 2006; pp. 1-68.

Satran, et al.; Internet Small Computer Systems Interface (iSCSI); IETF Network Working Group; RFC 3720; Apr. 2004; pp. 1-257.

Xin, et al.; Evaluation of Distributed Recovery in Large-Scale Storage Systems; 13th IEEE International Symposium on High Performance Distributed Computing; Jun. 2004; pp. 172-181.

Kubiatowicz, et al.; OceanStore: An Architecture for Global-Scale Persistent Storage; Appears in Proceedings of the Ninth International Conference on Architectural Support for Programming Languages and Operating Systems (ASPLOS 2000); Nov. 2000; pp. 1-12.

ADJUSTING A DISPERSAL PARAMETER OF DISPERSEDLY STORED DATA

CROSS REFERENCE TO RELATED PATENTS

The present U.S. Utility Patent Application claims priority pursuant to 35 U.S.C. §119(e) to U.S. Provisional Application No. 61/470,521, entitled "Flash Memory Utilization in a User Device of a Dispersed Storage Network," filed Apr. 1, 2011, pending, which is incorporated herein by reference in its entirety and made part of the present U.S. Utility Patent Application for all purposes.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

BACKGROUND OF THE INVENTION

1. Technical Field of the Invention

This invention relates generally to computing systems and more particularly to data storage solutions within such computing systems.

2. Description of Related Art

Computers are known to communicate, process, and store data. Such computers range from wireless smart phones to data centers that support millions of web searches, stock trades, or on-line purchases every day. In general, a computing system generates data and/or manipulates data from one form into another. For instance, an image sensor of the computing system generates raw picture data and, using an image compression program (e.g., JPEG, MPEG, etc.), the computing system manipulates the raw picture data into a standardized compressed image.

With continued advances in processing speed and communication speed, computers are capable of processing real time multimedia data for applications ranging from simple voice communications to streaming high definition video. As such, general-purpose information appliances are replacing purpose-built communications devices (e.g., a telephone). For example, smart phones can support telephony communications but they are also capable of text messaging and accessing the internet to perform functions including email, web browsing, remote applications access, and media communications (e.g., telephony voice, image transfer, music files, video files, real time video streaming. etc.).

Each type of computer is constructed and operates in accordance with one or more communication, processing, and storage standards. As a result of standardization and with advances in technology, more and more information content is being converted into digital formats. For example, more digital cameras are now being sold than film cameras, thus producing more digital pictures. As another example, web-based programming is becoming an alternative to over the air television broadcasts and/or cable broadcasts. As further examples, papers, books, video entertainment, home video, etc. are now being stored digitally, which increases the demand on the storage function of computers.

A typical computer storage system includes one or more memory devices aligned with the needs of the various operational aspects of the computer's processing and communication functions. Generally, the immediacy of access dictates what type of memory device is used. For example, random access memory (RAM) memory can be accessed in any random order with a constant response time, thus it is typically used for cache memory and main memory. By contrast, memory device technologies that require physical movement such as magnetic disks, tapes, and optical discs, have a variable response time as the physical movement can take longer than the data transfer, thus they are typically used for secondary memory (e.g., hard drive, backup memory, etc.).

A computer's storage system will be compliant with one or more computer storage standards that include, but are not limited to, network file system (NFS), flash file system (FFS), disk file system (DFS), small computer system interface (SCSI), internet small computer system interface (iSCSI), file transfer protocol (FTP), and web-based distributed authoring and versioning (WebDAV). These standards specify the data storage format (e.g., files, data objects, data blocks, directories, etc.) and interfacing between the computer's processing function and its storage system, which is a primary function of the computer's memory controller.

Despite the standardization of the computer and its storage system, memory devices fail; especially commercial grade memory devices that utilize technologies incorporating physical movement (e.g., a disc drive). For example, it is fairly common for a disc drive to routinely suffer from bit level corruption and to completely fail after three years of use. One solution is to a higher-grade disc drive, which adds significant cost to a computer.

Another solution is to utilize multiple levels of redundant disc drives to replicate the data into two or more copies. One such redundant drive approach is called redundant array of independent discs (RAID). In a RAID device, a RAID controller adds parity data to the original data before storing it across the array. The parity data is calculated from the original data such that the failure of a disc will not result in the loss of the original data. For example, RAID 5 uses three discs to protect data from the failure of a single disc. The parity data, and associated redundancy overhead data, reduces the storage capacity of three independent discs by one third (e.g., n−1=capacity). RAID 6 can recover from a loss of two discs and requires a minimum of four discs with a storage capacity of n−2.

While RAID addresses the memory device failure issue, it is not without its own failures issues that affect its effectiveness, efficiency and security. For instance, as more discs are added to the array, the probability of a disc failure increases, which increases the demand for maintenance. For example, when a disc fails, it needs to be manually replaced before another disc fails and the data stored in the RAID device is lost. To reduce the risk of data loss, data on a RAID device is typically copied on to one or more other RAID devices. While this addresses the loss of data issue, it raises a security issue since multiple copies of data are available, which increases the chances of unauthorized access. Further, as the amount of data being stored grows, the overhead of RAID devices becomes a non-trivial efficiency issue.

BRIEF DESCRIPTION OF THE SEVERAL VIEWS OF THE DRAWING(S)

DETAILED DESCRIPTION OF THE INVENTION

Figure 1:
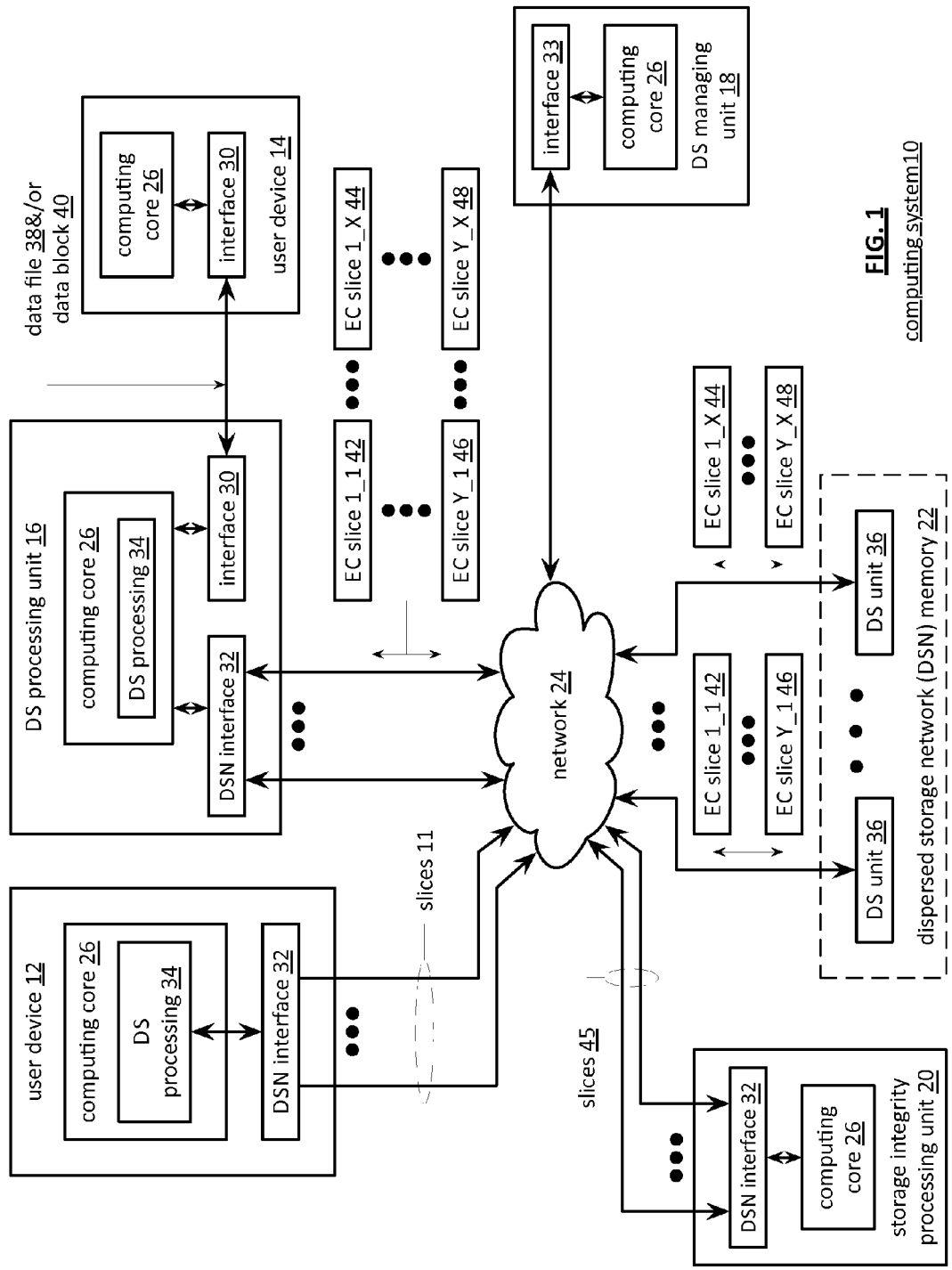
FIG. 1 is a schematic block diagram of an embodiment of a computing system in accordance with the present invention.

FIG. 1 is a schematic block diagram of a computing system 10 that includes one or more of a first type of user devices 12, one or more of a second type of user devices 14, at least one distributed storage (DS) processing unit 16, at least one DS managing unit 18, at least one storage integrity processing unit 20, and a distributed storage network (DSN) memory 22 coupled via a network 24. The network 24 may include one or more wireless and/or wire lined communication systems; one or more private intranet systems and/or public internet systems; and/or one or more local area networks (LAN) and/or wide area networks (WAN).

The DSN memory 22 includes a plurality of distributed storage (DS) units 36 for storing data of the system. Each of the DS units 36 includes a processing module and memory and may be located at a geographically different site than the other DS units (e.g., one in Chicago, one in Milwaukee, etc.).

Each of the user devices 12-14, the DS processing unit 16, the DS managing unit 18, and the storage integrity processing unit 20 may be a portable computing device (e.g., a social networking device, a gaming device, a cell phone, a smart phone, a personal digital assistant, a digital music player, a digital video player, a laptop computer, a handheld computer, a video game controller, and/or any other portable device that includes a computing core) and/or a fixed computing device (e.g., a personal computer, a computer server, a cable set-top box, a satellite receiver, a television set, a printer, a fax machine, home entertainment equipment, a video game console, and/or any type of home or office computing equipment). Such a portable or fixed computing device includes a computing core 26 and one or more interfaces 30, 32, and/or 33. An embodiment of the computing core 26 will be described with reference to FIG. 2.

With respect to the interfaces, each of the interfaces 30, 32, and 33 includes software and/or hardware to support one or more communication links via the network 24 indirectly and/or directly. For example, interfaces 30 support a communication link (wired, wireless, direct, via a LAN, via the network 24, etc.) between the second type of user device 14 and the DS processing unit 16. As another example, DSN interface 32 supports a plurality of communication links via the network 24 between the DSN memory 22 and the DS processing unit 16, the first type of user device 12, and/or the storage integrity processing unit 20. As yet another example, interface 33 supports a communication link between the DS managing unit 18 and any one of the other devices and/or units 12, 14, 16, 20, and/or 22 via the network 24.

In general and with respect to data storage, the system 10 supports three primary functions: distributed network data storage management, distributed data storage and retrieval, and data storage integrity verification. In accordance with these three primary functions, data can be distributedly stored in a plurality of physically different locations and subsequently retrieved in a reliable and secure manner regardless of failures of individual storage devices, failures of network equipment, the duration of storage, the amount of data being stored, attempts at hacking the data, etc.

The DS managing unit 18 performs distributed network data storage management functions, which include establishing distributed data storage parameters, performing network operations, performing network administration, and/or performing network maintenance. The DS managing unit 18 establishes the distributed data storage parameters (e.g., allocation of virtual DSN memory space, distributed storage parameters, security parameters, billing information, user profile information, etc.) for one or more of the user devices 12-14 (e.g., established for individual devices, established for a user group of devices, established for public access by the user devices, etc.). For example, the DS managing unit 18 coordinates the creation of a vault (e.g., a virtual memory block) within the DSN memory 22 for a user device (for a group of devices, or for public access). The DS managing unit 18 also determines the distributed data storage parameters for the vault. In particular, the DS managing unit 18 determines a number of slices (e.g., the number that a data segment of a data file and/or data block is partitioned into for distributed storage) and a read threshold value (e.g., the minimum number of slices required to reconstruct the data segment).

As another example, the DS managing module 18 creates and stores, locally or within the DSN memory 22, user profile information. The user profile information includes one or more of authentication information, permissions, and/or the security parameters. The security parameters may include one or more of encryption/decryption scheme, one or more encryption keys, key generation scheme, and data encoding/decoding scheme.

As yet another example, the DS managing unit 18 creates billing information for a particular user, user group, vault access, public vault access, etc. For instance, the DS managing unit 18 tracks the number of times user accesses a private vault and/or public vaults, which can be used to generate a per-access bill. In another instance, the DS managing unit 18 tracks the amount of data stored and/or retrieved by a user device and/or a user group, which can be used to generate a per-data-amount bill.

The DS managing unit 18 also performs network operations, network administration, and/or network maintenance. As at least part of performing the network operations and/or administration, the DS managing unit 18 monitors performance of the devices and/or units of the system 10 for potential failures, determines the devices and/or unit's activation status, determines the devices' and/or units' loading, and any other system level operation that affects the performance level of the system 10. For example, the DS managing unit 18 receives and aggregates network management alarms, alerts, errors, status information, performance information, and messages from the devices 12-14 and/or the units 16, 20, 22. For example, the DS managing unit 18 receives a simple network management protocol (SNMP) message regarding the status of the DS processing unit 16.

The DS managing unit 18 performs the network maintenance by identifying equipment within the system 10 that needs replacing, upgrading, repairing, and/or expanding. For example, the DS managing unit 18 determines that the DSN memory 22 needs more DS units 36 or that one or more of the DS units 36 needs updating.

The second primary function (i.e., distributed data storage and retrieval) begins and ends with a user device 12-14. For instance, if a second type of user device 14 has a data file 38 and/or data block 40 to store in the DSN memory 22, it send the data file 38 and/or data block 40 to the DS processing unit 16 via its interface 30. As will be described in greater detail with reference to FIG. 2, the interface 30 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). In addition, the interface 30 may attach a user identification code (ID) to the data file 38 and/or data block 40.

The DS processing unit 16 receives the data file 38 and/or data block 40 via its interface 30 and performs a distributed storage (DS) process 34 thereon (e.g., an error coding dispersal storage function). The DS processing 34 begins by partitioning the data file 38 and/or data block 40 into one or more data segments, which is represented as Y data segments. For example, the DS processing 34 may partition the data file 38 and/or data block 40 into a fixed byte size segment (e.g., $2^1$ to $2^n$ bytes, where n=>2) or a variable byte size (e.g., change byte size from segment to segment, or from groups of segments to groups of segments, etc.).

For each of the Y data segments, the DS processing 34 error encodes (e.g., forward error correction (FEC), information dispersal algorithm, or error correction coding) and slices (or slices then error encodes) the data segment into a plurality of error coded (EC) data slices 42-48, which is represented as X slices per data segment. The number of slices (X) per segment, which corresponds to a number of pillars n, is set in accordance with the distributed data storage parameters and the error coding scheme. For example, if a Reed-Solomon (or other FEC scheme) is used in an n/k system, then a data segment is divided into n slices, where k number of slices is needed to reconstruct the original data (i.e., k is the threshold). As a few specific examples, the n/k factor may be 5/3; 6/4; 8/6; 8/5; 16/10.

For each slice 42-48, the DS processing unit 16 creates a unique slice name and appends it to the corresponding slice 42-48. The slice name includes universal DSN memory addressing routing information (e.g., virtual memory addresses in the DSN memory 22) and user-specific information (e.g., user ID, file name, data block identifier, etc.).

The DS processing unit 16 transmits the plurality of EC slices 42-48 to a plurality of DS units 36 of the DSN memory 22 via the DSN interface 32 and the network 24. The DSN interface 32 formats each of the slices for transmission via the network 24. For example, the DSN interface 32 may utilize an internet protocol (e.g., TCP/IP, etc.) to packetize the slices 42-48 for transmission via the network 24.

The number of DS units 36 receiving the slices 42-48 is dependent on the distributed data storage parameters established by the DS managing unit 18. For example, the DS managing unit 18 may indicate that each slice is to be stored in a different DS unit 36. As another example, the DS managing unit 18 may indicate that like slice numbers of different data segments are to be stored in the same DS unit 36. For example, the first slice of each of the data segments is to be stored in a first DS unit 36, the second slice of each of the data segments is to be stored in a second DS unit 36, etc. In this manner, the data is encoded and distributedly stored at physically diverse locations to improved data storage integrity and security.

Each DS unit 36 that receives a slice 42-48 for storage translates the virtual DSN memory address of the slice into a local physical address for storage. Accordingly, each DS unit 36 maintains a virtual to physical memory mapping to assist in the storage and retrieval of data.

The first type of user device 12 performs a similar function to store data in the DSN memory 22 with the exception that it includes the DS processing. As such, the device 12 encodes and slices the data file and/or data block it has to store. The device then transmits the slices 11 to the DSN memory via its DSN interface 32 and the network 24.

For a second type of user device 14 to retrieve a data file or data block from memory, it issues a read command via its interface 30 to the DS processing unit 16. The DS processing unit 16 performs the DS processing 34 to identify the DS units 36 storing the slices of the data file and/or data block based on the read command. The DS processing unit 16 may also communicate with the DS managing unit 18 to verify that the user device 14 is authorized to access the requested data.

Assuming that the user device is authorized to access the requested data, the DS processing unit 16 issues slice read commands to at least a threshold number of the DS units 36 storing the requested data (e.g., to at least 10 DS units for a 16/10 error coding scheme). Each of the DS units 36 receiving the slice read command, verifies the command, accesses its virtual to physical memory mapping, retrieves the requested slice, or slices, and transmits it to the DS processing unit 16.

Once the DS processing unit 16 has received a read threshold number of slices for a data segment, it performs an error decoding function and de-slicing to reconstruct the data segment. When Y number of data segments has been reconstructed, the DS processing unit 16 provides the data file 38 and/or data block 40 to the user device 14. Note that the first type of user device 12 performs a similar process to retrieve a data file and/or data block.

The storage integrity processing unit 20 performs the third primary function of data storage integrity verification. In general, the storage integrity processing unit 20 periodically retrieves slices 45, and/or slice names, of a data file or data block of a user device to verify that one or more slices have not been corrupted or lost (e.g., the DS unit failed). The retrieval process mimics the read process previously described.

If the storage integrity processing unit 20 determines that one or more slices is corrupted or lost, it rebuilds the corrupted or lost slice(s) in accordance with the error coding scheme. The storage integrity processing unit 20 stores the rebuild slice, or slices, in the appropriate DS unit(s) 36 in a manner that mimics the write process previously described.

Figure 2:
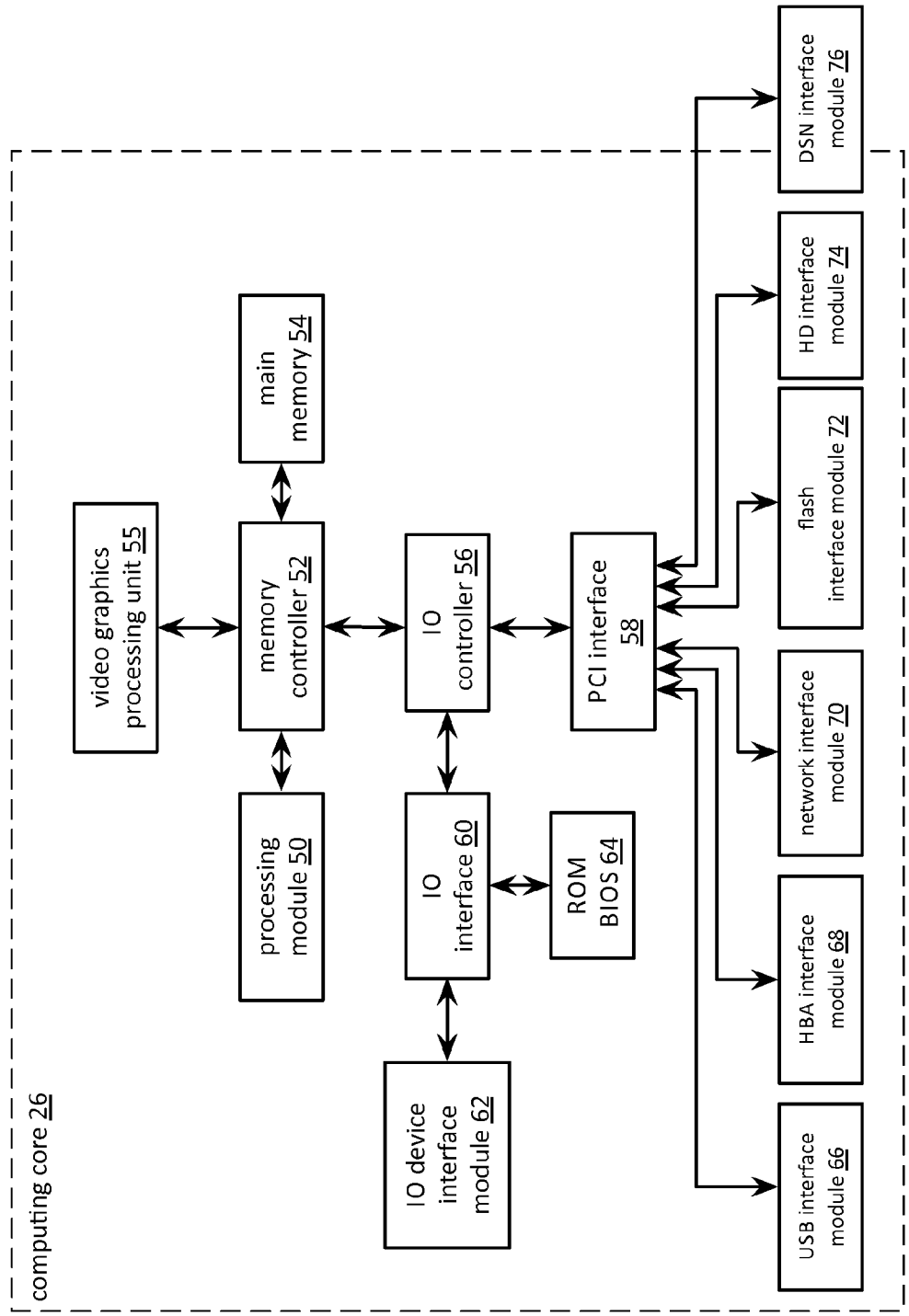
FIG. 2 is a schematic block diagram of an embodiment of a computing core in accordance with the present invention.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, at least one IO device interface module 62, a read only memory (ROM) basic input output system (BIOS) 64, and one or more memory interface modules. The memory interface module(s) includes one or more of a universal serial bus (USB) interface module 66, a host bus adapter (HBA) interface module 68, a network interface module 70, a flash interface module 72, a hard drive interface module 74, and a DSN interface module 76. Note the DSN interface module 76 and/or the network interface module 70 may function as the interface 30 of the user device 14 of FIG. 1. Further note that the IO device interface module 62 and/or the memory interface modules may be collectively or individually referred to as IO ports.

Figure 3:
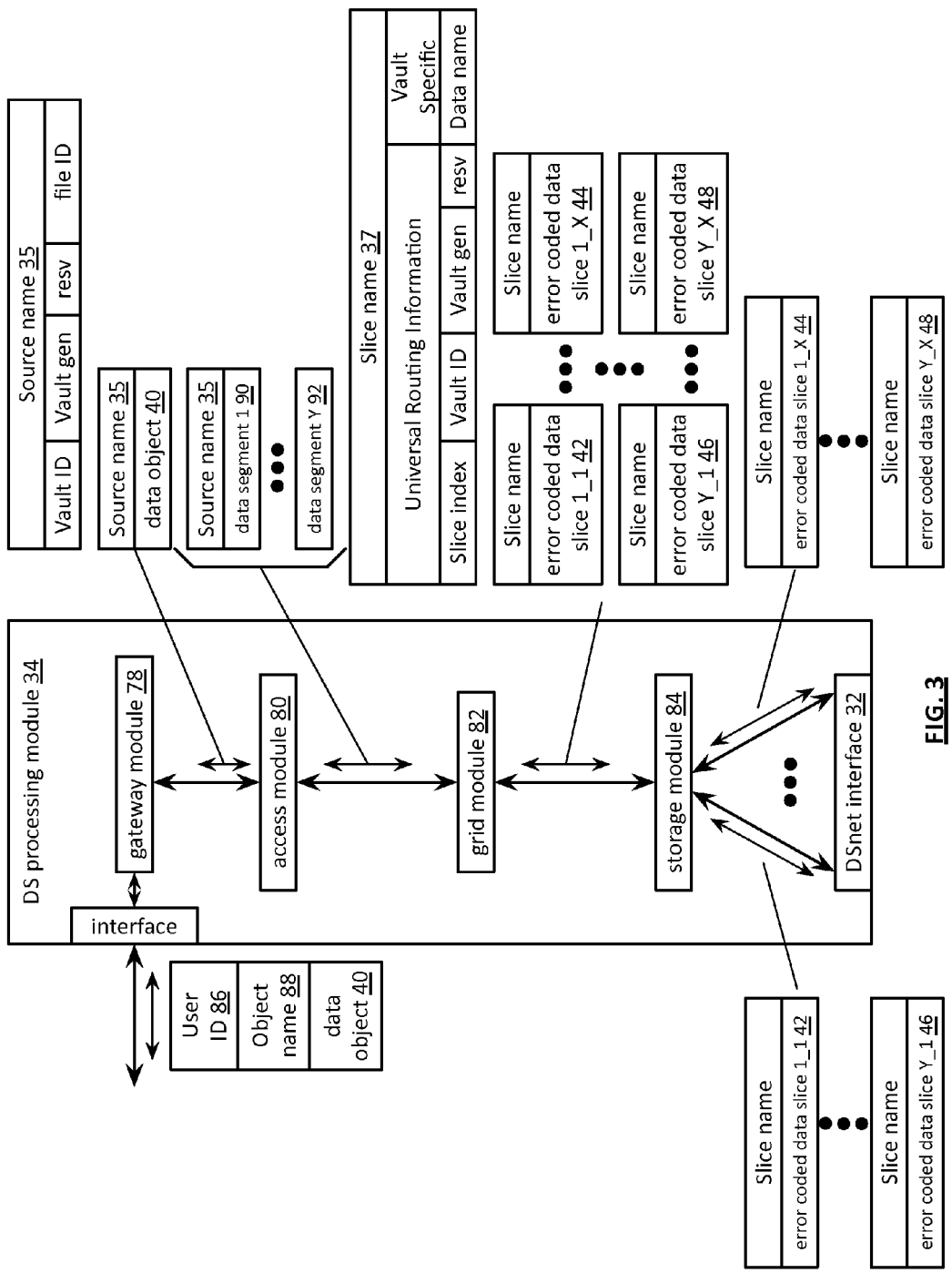
FIG. 3 is a schematic block diagram of an embodiment of a distributed storage processing unit in accordance with the present invention.

FIG. 3 is a schematic block diagram of an embodiment of a dispersed storage (DS) processing module 34 of user device 12 and/or of the DS processing unit 16. The DS processing module 34 includes a gateway module 78, an access module 80, a grid module 82, and a storage module 84. The DS processing module 34 may also include an interface 30 and the DSnet interface 32 or the interfaces 68 and/or 70 may be part of user 12 or of the DS processing unit 14. The DS processing module 34 may further include a bypass/feedback path between the storage module 84 to the gateway module 78. Note that the modules 78-84 of the DS processing module 34 may be in a single unit or distributed across multiple units.

In an example of storing data, the gateway module 78 receives an incoming data object that includes a user ID field 86, an object name field 88, and the data field 40 and may also receive corresponding information that includes a process identifier (e.g., an internal process/application ID), metadata, a file system directory, a block number, a transaction message, a user device identity (ID), a data object identifier, a source name, and/or user information. The gateway module 78 authenticates the user associated with the data object by verifying the user ID 86 with the managing unit 18 and/or another authenticating unit.

When the user is authenticated, the gateway module 78 obtains user information from the management unit 18, the user device, and/or the other authenticating unit. The user information includes a vault identifier, operational parameters, and user attributes (e.g., user data, billing information, etc.). A vault identifier identifies a vault, which is a virtual memory space that maps to a set of DS storage units 36. For example, vault 1 (i.e., user 1's DSN memory space) includes eight DS storage units (X=8 wide) and vault 2 (i.e., user 2's DSN memory space) includes sixteen DS storage units (X=16 wide). The operational parameters may include an error coding algorithm, the width n (number of pillars X or slices per segment for this vault), a read threshold T, a write threshold, an encryption algorithm, a slicing parameter, a compression algorithm, an integrity check method, caching settings, parallelism settings, and/or other parameters that may be used to access the DSN memory layer.

The gateway module 78 uses the user information to assign a source name 35 to the data. For instance, the gateway module 78 determines the source name 35 of the data object 40 based on the vault identifier and the data object. For example, the source name may contain a file identifier (ID), a vault generation number, a reserved field, and a vault identifier (ID). As another example, the gateway module 78 may generate the file ID based on a hash function of the data object 40. Note that the gateway module 78 may also perform message conversion, protocol conversion, electrical conversion, optical conversion, access control, user identification, user information retrieval, traffic monitoring, statistics generation, configuration, management, and/or source name determination.

The access module 80 receives the data object 40 and creates a series of data segments 1 through Y 90-92 in accordance with a data storage protocol (e.g., file storage system, a block storage system, and/or an aggregated block storage system). The number of segments Y may be chosen or randomly assigned based on a selected segment size and the size of the data object. For example, if the number of segments is chosen to be a fixed number, then the size of the segments varies as a function of the size of the data object. For instance, if the data object is an image file of 4,194,304 eight bit bytes (e.g., 33,554,432 bits) and the number of segments Y=131,072, then each segment is 256 bits or 32 bytes. As another example, if segment sized is fixed, then the number of segments Y varies based on the size of data object. For instance, if the data object is an image file of 4,194,304 bytes and the fixed size of each segment is 4,096 bytes, the then number of segments Y=1,024. Note that each segment is associated with the same source name.

The grid module 82 receives the data segments and may manipulate (e.g., compression, encryption, cyclic redundancy check (CRC), etc.) each of the data segments before performing an error coding function of the error coding dispersal storage function to produce a pre-manipulated data segment. After manipulating a data segment, if applicable, the grid module 82 error encodes (e.g., Reed-Solomon, Convolution encoding, Trellis encoding, etc.) the data segment or manipulated data segment into X error coded data slices 42-44.

The value X, or the number of pillars (e.g., X=16), is chosen as a parameter of the error coding dispersal storage function. Other parameters of the error coding dispersal function include a read threshold T, a write threshold W, etc. The read threshold (e.g., T=10, when X=16) corresponds to the minimum number of error-free error coded data slices required to reconstruct the data segment. In other words, the DS processing module 34 can compensate for X−T (e.g., 16−10=6) missing error coded data slices per data segment. The write threshold W corresponds to a minimum number of DS storage units that acknowledge proper storage of their respective data slices before the DS processing module indicates proper storage of the encoded data segment. Note that the write threshold is greater than or equal to the read threshold for a given number of pillars (X).

For each data slice of a data segment, the grid module 82 generates a unique slice name 37 and attaches it thereto. The slice name 37 includes a universal routing information field and a vault specific field and may be 48 bytes (e.g., 24 bytes for each of the universal routing information field and the vault specific field). As illustrated, the universal routing information field includes a slice index, a vault ID, a vault generation, and a reserved field. The slice index is based on the pillar number and the vault ID and, as such, is unique for each pillar (e.g., slices of the same pillar for the same vault for any segment will share the same slice index). The vault specific field includes a data name, which includes a file ID and a segment number (e.g., a sequential numbering of data segments 1-Y of a simple data object or a data block number).

Prior to outputting the error coded data slices of a data segment, the grid module may perform post-slice manipulation on the slices. If enabled, the manipulation includes slice level compression, encryption, CRC, addressing, tagging, and/or other manipulation to improve the effectiveness of the computing system.

When the error coded data slices of a data segment are ready to be outputted, the grid module 82 determines which of the DS storage units 36 will store the EC data slices based on a dispersed storage memory mapping associated with the user's vault and/or DS storage unit attributes. The DS storage unit attributes may include availability, self-selection, performance history, link speed, link latency, ownership, available DSN memory, domain, cost, a prioritization scheme, a centralized selection message from another source, a lookup table, data ownership, and/or any other factor to optimize the operation of the computing system. Note that the number of DS storage units 36 is equal to or greater than the number of pillars (e.g., X) so that no more than one error coded data slice of the same data segment is stored on the same DS storage unit 36. Further note that EC data slices of the same pillar number but of different segments (e.g., EC data slice 1 of data segment 1 and EC data slice 1 of data segment 2) may be stored on the same or different DS storage units 36.

The storage module 84 performs an integrity check on the outbound encoded data slices and, when successful, identifies a plurality of DS storage units based on information provided by the grid module 82. The storage module 84 then outputs the encoded data slices 1 through X of each segment 1 through Y to the DS storage units 36. Each of the DS storage units 36 stores its EC data slice(s) and maintains a local virtual DSN address to physical location table to convert the virtual DSN address of the EC data slice(s) into physical storage addresses.

In an example of a read operation, the user device 12 and/or 14 sends a read request to the DS processing unit 14, which authenticates the request. When the request is authentic, the DS processing unit 14 sends a read message to each of the DS storage units 36 storing slices of the data object being read. The slices are received via the DSnet interface 32 and processed by the storage module 84, which performs a parity check and provides the slices to the grid module 82 when the parity check was successful. The grid module 82 decodes the slices in accordance with the error coding dispersal storage function to reconstruct the data segment. The access module 80 reconstructs the data object from the data segments and the gateway module 78 formats the data object for transmission to the user device.

Figure 4:
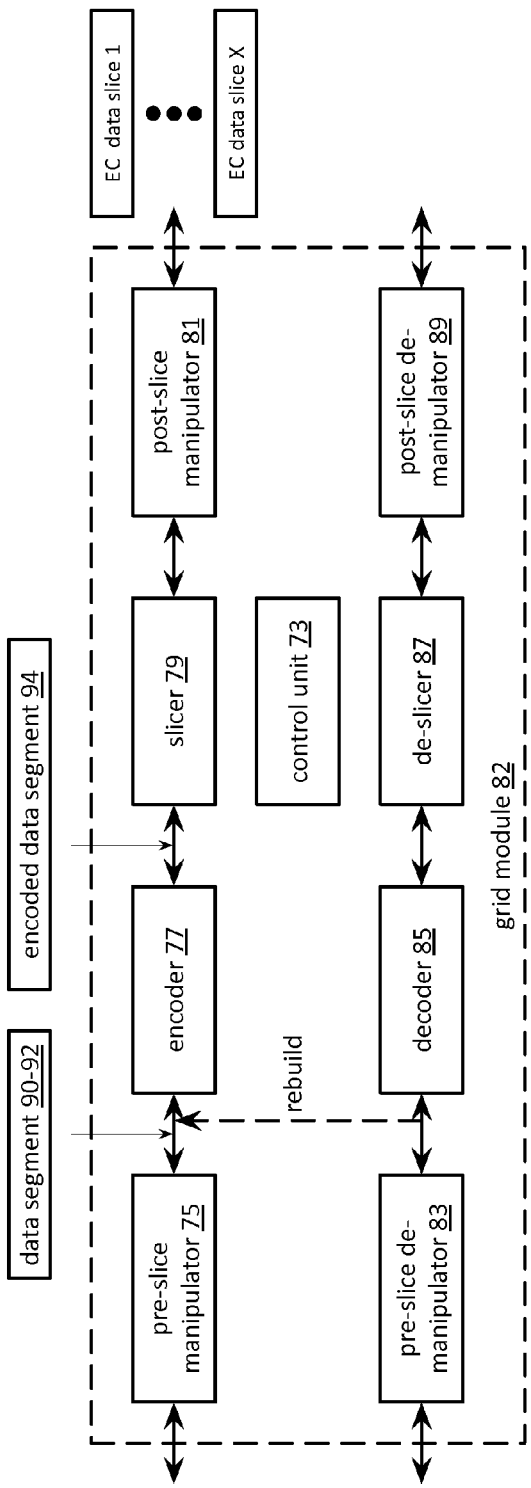
FIG. 4 is a schematic block diagram of an embodiment of a grid module in accordance with the present invention.

FIG. 4 is a schematic block diagram of an embodiment of a grid module 82 that includes a control unit 73, a pre-slice manipulator 75, an encoder 77, a slicer 79, a post-slice manipulator 81, a pre-slice de-manipulator 83, a decoder 85, a de-slicer 87, and/or a post-slice de-manipulator 89. Note that the control unit 73 may be partially or completely external to the grid module 82. For example, the control unit 73 may be part of the computing core at a remote location, part of a user device, part of the DS managing unit 18, or distributed amongst one or more DS storage units.

In an example of write operation, the pre-slice manipulator 75 receives a data segment 90-92 and a write instruction from an authorized user device. The pre-slice manipulator 75 determines if pre-manipulation of the data segment 90-92 is required and, if so, what type. The pre-slice manipulator 75 may make the determination independently or based on instructions from the control unit 73, where the determination is based on a computing system-wide predetermination, a table lookup, vault parameters associated with the user identification, the type of data, security requirements, available DSN memory, performance requirements, and/or other metadata.

Once a positive determination is made, the pre-slice manipulator 75 manipulates the data segment 90-92 in accordance with the type of manipulation. For example, the type of manipulation may be compression (e.g., Lempel-Ziv-Welch, Huffman, Golomb, fractal, wavelet, etc.), signatures (e.g., Digital Signature Algorithm (DSA), Elliptic Curve DSA, Secure Hash Algorithm, etc.), watermarking, tagging, encryption (e.g., Data Encryption Standard, Advanced Encryption Standard, etc.), adding metadata (e.g., time/date stamping, user information, file type, etc.), cyclic redundancy check (e.g., CRC32), and/or other data manipulations to produce the pre-manipulated data segment.

The encoder 77 encodes the pre-manipulated data segment 92 using a forward error correction (FEC) encoder (and/or other type of erasure coding and/or error coding) to produce an encoded data segment 94. The encoder 77 determines which forward error correction algorithm to use based on a predetermination associated with the user's vault, a time based algorithm, user direction, DS managing unit direction, control unit direction, as a function of the data type, as a function of the data segment 92 metadata, and/or any other factor to determine algorithm type. The forward error correction algorithm may be Golay, Multidimensional parity, Reed-Solomon, Hamming, Bose Ray Chauduri Hocquenghem (BCH), Cauchy-Reed-Solomon, or any other FEC encoder. Note that the encoder 77 may use a different encoding algorithm for each data segment 92, the same encoding algorithm for the data segments 92 of a data object, or a combination thereof.

The encoded data segment 94 is of greater size than the data segment 92 by the overhead rate of the encoding algorithm by a factor of X/T, where X is the width or number of slices, and T is the read threshold. In this regard, the corresponding decoding process can accommodate at most X−T missing EC data slices and still recreate the data segment 92. For example, if X=16 and T=10, then the data segment 92 will be recoverable as long as 10 or more EC data slices per segment are not corrupted.

The slicer 79 transforms the encoded data segment 94 into EC data slices in accordance with the slicing parameter from the vault for this user and/or data segment 92. For example, if the slicing parameter is X=16, then the slicer 79 slices each encoded data segment 94 into 16 encoded slices.

The post-slice manipulator 81 performs, if enabled, post-manipulation on the encoded slices to produce the EC data slices. If enabled, the post-slice manipulator 81 determines the type of post-manipulation, which may be based on a computing system-wide predetermination, parameters in the vault for this user, a table lookup, the user identification, the type of data, security requirements, available DSN memory, performance requirements, control unit directed, and/or other metadata. Note that the type of post-slice manipulation may include slice level compression, signatures, encryption, CRC, addressing, watermarking, tagging, adding metadata, and/or other manipulation to improve the effectiveness of the computing system.

In an example of a read operation, the post-slice de-manipulator 89 receives at least a read threshold number of EC data slices and performs the inverse function of the post-slice manipulator 81 to produce a plurality of encoded slices. The de-slicer 87 de-slices the encoded slices to produce an encoded data segment 94. The decoder 85 performs the inverse function of the encoder 77 to recapture the data segment 90-92. The pre-slice de-manipulator 83 performs the inverse function of the pre-slice manipulator 75 to recapture the data segment 90-92.

Figure 5:
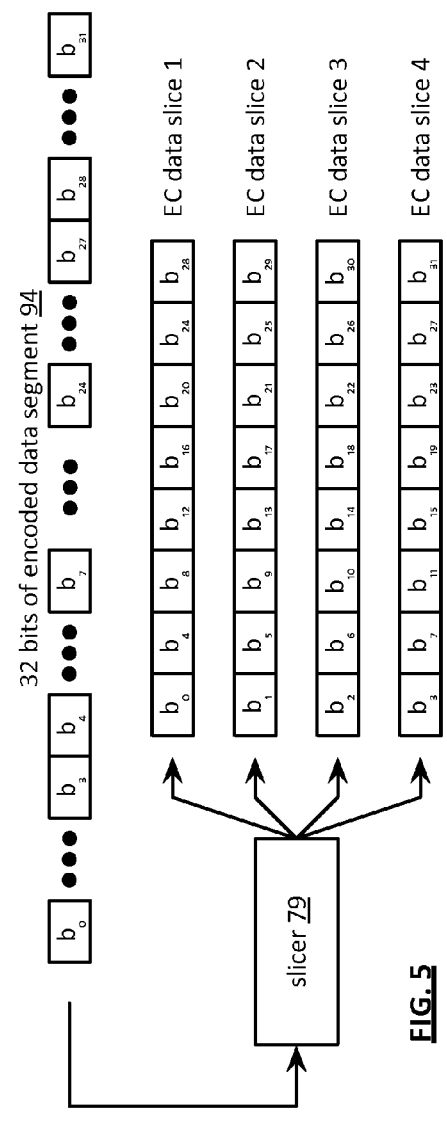
FIG. 5 is a diagram of an example embodiment of error coded data slice creation in accordance with the present invention.

FIG. 5 is a diagram of an example of slicing an encoded data segment 94 by the slicer 79. In this example, the encoded data segment 94 includes thirty-two bits, but may include more or less bits. The slicer 79 disperses the bits of the encoded data segment 94 across the EC data slices in a pattern as shown. As such, each EC data slice does not include consecutive bits of the data segment 94 reducing the impact of consecutive bit failures on data recovery. For example, if EC data slice 2 (which includes bits 1, 5, 9, 13, 17, 25, and 29) is unavailable (e.g., lost, inaccessible, or corrupted), the data segment can be reconstructed from the other EC data slices (e.g., 1, 3 and 4 for a read threshold of 3 and a width of 4).

Figure 6:
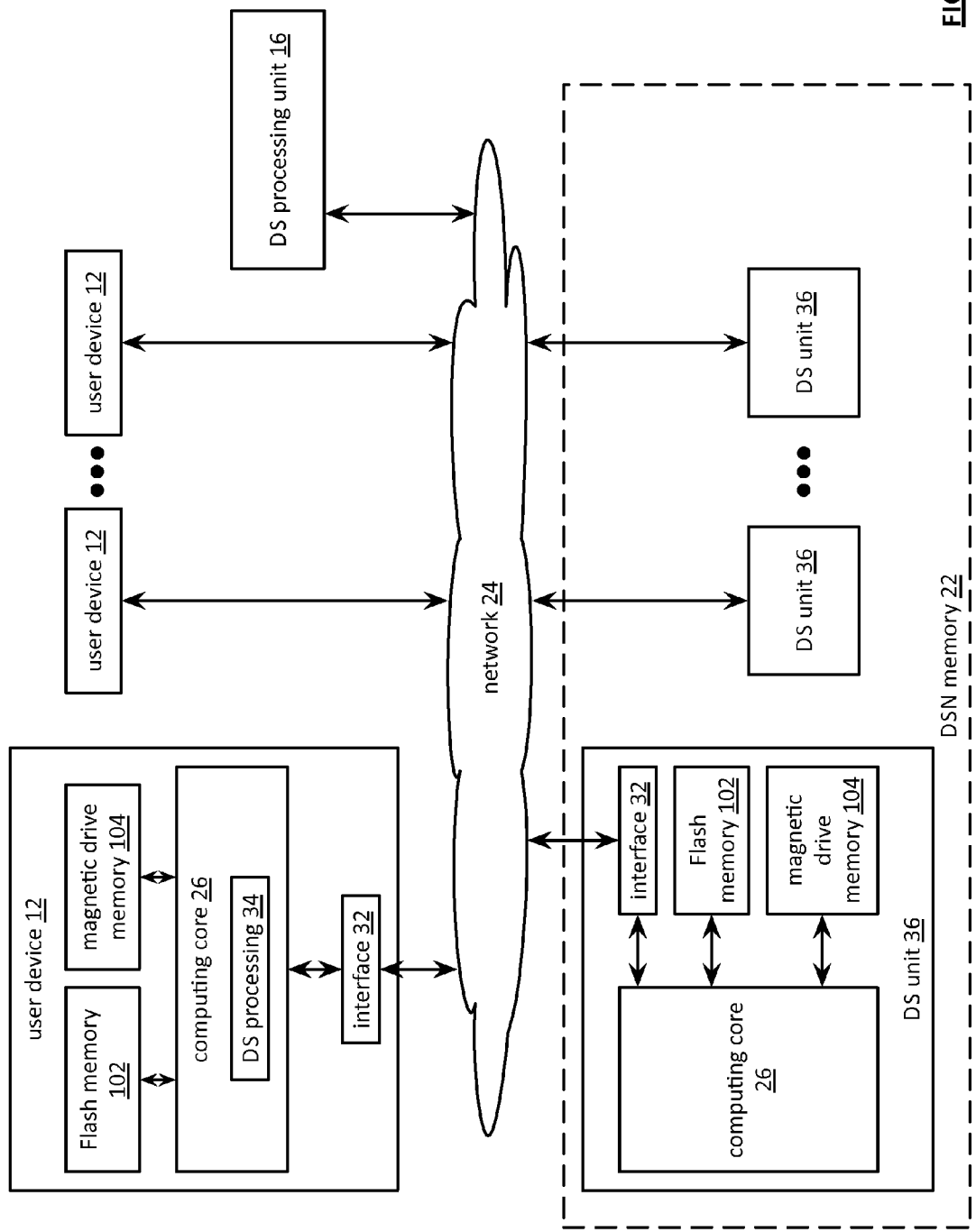
FIG. 6 is a schematic block diagram of another embodiment of a computing system in accordance with the present invention.

FIG. 6 is a schematic block diagram of another embodiment of a computing system that includes one or more user devices 12, a dispersed storage (DS) processing unit 16, a network 24, and a dispersed storage network (DSN) memory 22. The user device 12 may include one or more of a computing core 26, an interface 32, a Flash memory 102, and a magnetic drive memory 104. The computing core 26 includes a DS processing 34. The DS memory 22 includes a plurality of DS units 36. The DS unit 36 includes one or more of the computing core 26, the interface 32, the Flash memory 102, and the magnetic drive memory 104.

The Flash memory 102 provides a first memory type and may be implemented utilizing non-volatile electrically erasable programmable read-only memory (EEPROM). An alternative non-volatile solid-state storage technology including one or more of static random access memory (SRAM) and dynamic random access memory (DRAM) may be utilized as a substitute for the Flash memory 102. The magnetic drive memory 104 provides a second memory type and may be implemented utilizing a non-volatile random access memory device that includes rotating rigid platters spun by a motor, wherein the rotating rigid platters serve to magnetically store data that is written and read utilizing a read/write head that floats above the platters. Such a first memory device type and a second memory device type provide storage of data in accordance with memory storage characteristics. For example, the first memory device type provides faster access via lower access latency when implemented with Flash memory technology as compared to the second memory device type when implemented with magnetic drive memory technology. As another example, the second memory device type provides lower-cost storage on a normalized basis when implemented with the magnetic drive memory technology as compared to the first memory device type when implemented with the flash memory technology.

The DS processing 34 of the user device 12 of the one or more user devices 12 generates encoded data slices and facilitates storing the encoded data slices in one or more memories of the computing system. Alternatively, a DS processing unit 34 of the DS processing unit 16 generates encoded data slices and facilitates storing the encoded data slices in the one or more memories of the computing system. The memories of the computing system includes Flash memory 102 of each user device 12 of the one or more user devices 12, magnetic drive memory 104 of each user device 12 of the one or more user devices 12, Flash memory 102 of each DS unit 36 of the plurality of DS units 36, and magnetic drive memory 104 of each DS unit 36 of the plurality of the DSN memory 22.

The DS processing 34 facilitates the storing of the encoded data slices in the one or more memories of the computing system by selecting one or more storage locations based on a storage requirement. The storage requirement includes one or more of a security requirement, a performance requirement, a reliability requirement, a predetermination, a cost requirement, a memory availability indicator, and a memory availability requirement. For example, the DS processing 34 selects a local Flash memory 102 of an associated user device 12 when the performance requirement includes a very low retrieval access latency requirement. As another example, the DS processing 34 selects a magnetic drive memory 104 of a DS unit 36 when the cost requirement indicates a very low cost requirement and when the reliability requirement indicates a very high required reliability level. As yet another example, the DS processing 34 selects a set of Flash memories associated with a set of other user devices 12 when a set of memory availability indicators associated with the set of other user devices 12 compares favorably to the memory availability requirement.

In an example of operation, a DS processing 34 of a first user device 12 dispersed storage error encodes data to produce a plurality of sets of encoded data slices. The DS processing 34 selects a set of Flash memories associated with a set of other user devices 12 of the one or more user devices 12. The DS processing 34 stores a decode threshold number (e.g., k) of encoded data slices of a set of the plurality of sets of encoded data slices in a local flash memory associated with the first user device 12. The DS processing 34 outputs other encoded data slices of the set of the plurality of sets of encoded data slices to the set of other user devices 12 via the interface 32 and the network 24 for storage therein.

In another example of operation, the DS processing 34 of the first user device 12 dispersed storage error encodes data to produce the plurality of sets of encoded data slices. The DS processing 34 selects a set of magnetic drive memories associated with a set of DS units 36 of the plurality of DS units 36. The DS processing 34 stores the decode threshold number (e.g., k) of encoded data slices of the set of the plurality of sets of encoded data slices in the local flash memory associated with the first user device 12. The DS processing 34 outputs other encoded data slices of the set of the plurality of sets of encoded data slices to the set of DS units 36 via the interface 32 of the first user device 12, the network 24, the interface 32 of each DS unit 36 of the set of DS units 36, and each computing core 26 of the set of DS units 36 for storage in a set of magnetic drive memories of the set of DS units 36.

Alternatively, the DS processing 34 outputs the other encoded data slices of a set of the plurality of sets of encoded data slices via the interface 32 of the first user device 12 and the network 24 to the DS processing unit 16. Next, the DS processing unit 16 dispersed storage error encodes each encoded data slice of the other encoded data slices to produce a plurality of groups of at least one set of encoded data sub-slice corresponding to each encoded data slice of the other encoded data slices. The DS processing unit 16 sends the plurality of groups of at least one encoded data sub-slice via the network 24 to a set of DS units 36 for storage therein. The method of operation is discussed in greater detail with reference to FIGS. 7A-12B.

Figure 7A:
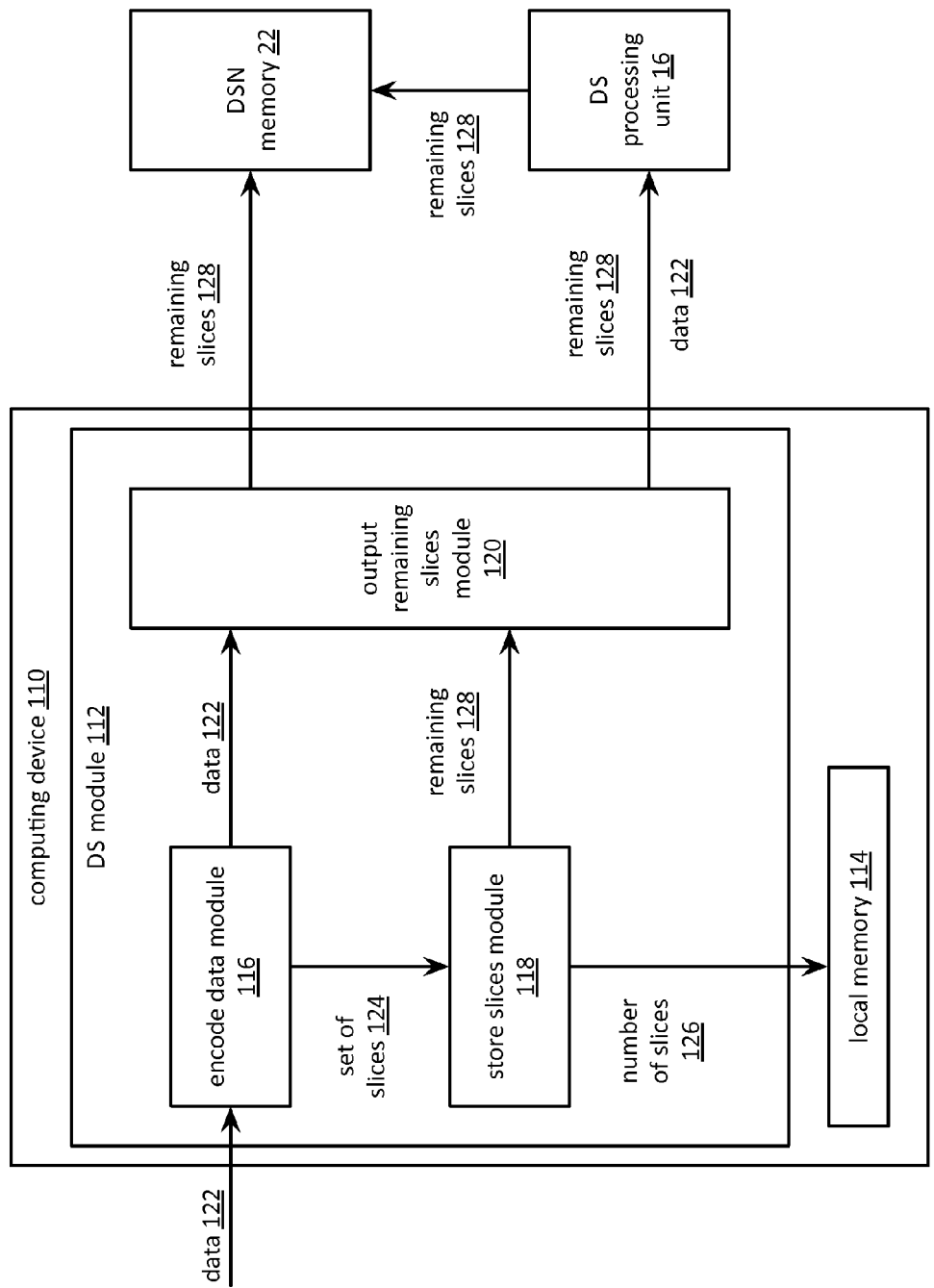
FIG. 7A is a schematic block diagram of another embodiment of a computing system in accordance with the present invention.

FIG. 7A is a schematic block diagram of another embodiment of a computing system that includes a computing device 110, a dispersed storage (DS) processing unit 16, and a dispersed storage network (DSN) memory 22. The DSN memory 22 includes one or more of a secondary magnetic drive memory, a computing device memory, a user device memory, and at least one set of DS units. The computing device 110 includes a DS module 112 and a local memory 114. The local memory 114 may include one or more memory devices, wherein each memory device includes one or more of a flash memory 102, a magnetic drive memory 104, a primary magnetic drive memory, a computing device memory, a local user device memory, a solid-state memory, and an optical memory. Alternatively, the local memory 114 may include memory associated with two or more computing devices 110. The DS module 112 includes an encode data module 116, a store slices module 118, and an output remaining slices module 120.

The encode data module 116, when operable within a computing device, causes the computing device 110 to encode data 122 utilizing a dispersed storage error coding function to produce a set of encoded data slices 124, wherein the dispersed storage error coding function includes a decode threshold parameter and a pillar width parameter. The encoding may further include receiving a data storage request, wherein the request includes a storage requirement including one or more of reliability, memory utilization, access latency, and security. The encode data module 116 further functions to encode the data 122 by establishing the decode threshold parameter and the pillar width parameter based on one or more of physical characteristics of the local memory and a local memory performance characteristic. The local memory performance characteristic includes one or more of memory utilization, data retrieval reliability, and data retrieval latency. The local memory physical characteristic includes one or more of a type of memory device and a number of memory devices included in the local memory 114. For example, the encode data module 116 establishes the decode threshold parameter as 10 when the local memory 114 includes 10 memory devices. As another example, the encode data module 116 establishes the decode threshold parameter as 5 and the pillar width parameter as 21 when the local memory 114 includes three memory devices and a local memory performance characteristic indicates a below average data retrieval reliability level.

The store slices module 118, when operable within the computing device, causes the computing device to store a number of encoded data slices 126 of the set of encoded data slices 124 in the local memory 114, wherein the number is based on the decode threshold parameter and is less than the pillar width parameter. The storing may include selecting the number of encoded data slices 126 and writing each of the number of encoded data slices 126 to the local memory 114. The store slices module 118, when operable within the computing device 110, further causes the computing device 110 to determine the number of encoded data slices 126 by at least one of performing a mathematical function on the decode threshold parameter and performing a second mathematical function based on at least one of physical structure of the local memory and performance characteristics of the local memory 114. For example, the store slices module 118 determines the number of encoded data slices 126 to be the decode threshold parameter when a physical structure of the local memory indicates that more than a decode threshold parameter number of memory devices are available. As another example, the store slices module 118 determines the number of encoded data slices 126 to be the decode threshold parameter minus two when a performance characteristic of the local memory 114 indicates below average performance. As yet another example, the store slices module 118 determines the number of encoded data slices 126 to be the decode threshold parameter plus three when a physical structure of the local memory 114 indicates that less than a decode threshold parameter number of memory devices are available.

The encode data module 116, when operable within the computing device 110, further causes the computing device 110 to encode the data utilizing the dispersed storage error coding function to produce a plurality of sets of encoded data slices, which includes the set of encoded data slices. The store slices module 118, when operable within the computing device 110, further causes the computing device 110 to determine, in accordance with a set storage protocol, the number of encoded data slices of one or more sets of the plurality of sets of encoded data slices. For example, the store slices module 118 determines a common number of encoded data slices for each set of the plurality of sets of encoded data slices when a set storage protocol indicates to utilize a common number. As another example, the store slices module 118 determines a unique number of encoded data slices for each set of the plurality of sets of encoded data slices when a set storage protocol indicates to utilize a unique number for each set of encoded data slices.

The store slices module 118 further functions to store the number of encoded data slices 126 by selecting the number of encoded data slices 126 from the set of encoded data slices 124 based on the dispersed storage error coding function and issuing a number of write requests to the local memory 114 for the number of encoded data slices 126. For example, the store slices module 118 selects the number of encoded data slices 126 aligned with subsequent decoding of the decode threshold parameter number of encoded data slices to improve recovery latency time. For instance, the store slices module 118 selects the number of encoded data slices associated with a first decode threshold parameter number of pillars when a unity matrix is used within a generator matrix of the dispersed storage error coding function.

The output remaining slices module 120, when operable within the computing device 110, causes the computing device 110 to output remaining encoded data slices 128 of the set of encoded data slices 124 to the DSN memory 22. The outputting may include selecting the remaining encoded data slices 128 (e.g., pillar width-number) and sending the remaining encoded data slices 128 to the DSN memory 22. The output remaining slices module 120 further functions to output the remaining encoded data slices 128 by sending the remaining encoded data slices 128 to the DS processing unit 16; or (e.g., the DS processing unit 16 directly stores slices or encodes new slices for storage in the DSN memory 22) sending the data 122 and the number to the DS processing unit 16, wherein the DS processing unit 16 encodes the data 122 utilizing the dispersed storage error coding function to produce another set of encoded data slices, identifies the remaining encoded data slices 128 from the other set of encoded data slices based on the number and the a set by set basis, for the plurality, or for groupings of the plurality, and outputs the remaining encoded data slices 128 to the DSN memory 22; and updating an encoded data slice mapping. The updating of the encoded data slice mapping includes listing identities of one or more of the remaining encoded data slices 128, a DSN source name received from the DS processing unit 16, and a corresponding identity of the DS processing unit 16.

The outputting remaining encoded data slices 128 further includes one or more of selecting a memory of the DSN memory 22 based on one or more DSN memory performance characteristics (e.g., DSN memory utilization, DSN memory data retrieval reliability, DSN memory data retrieval latency; selecting further includes selecting based on at least one of a security requirement, a predetermination, and a message), sending a write encoded data slice request to the at least one memory for each encoded data slice of the remaining encoded data slices 128, wherein each write encoded data slice request includes a corresponding encoded data slice of the remaining encoded data slices 128, and updating an encoded data slice mapping. (e.g., list identities of the remaining encoded data slices 128 and corresponding identities of the selected at least one memory)

Figure 7B:
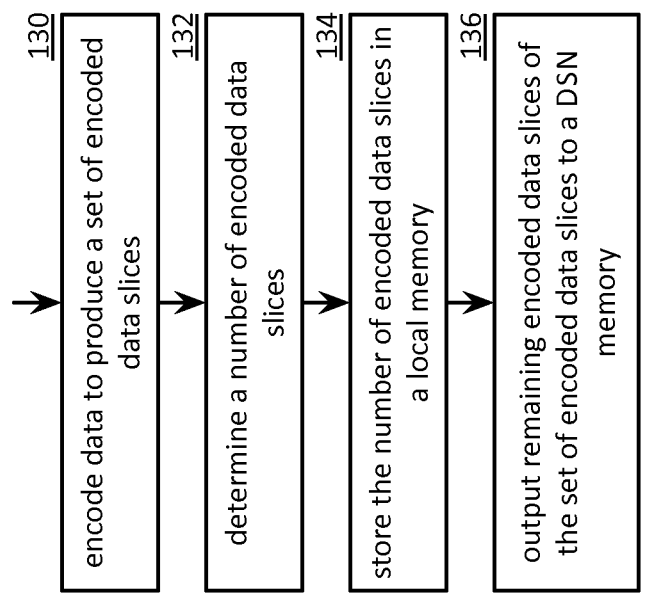
FIG. 7B is a flowchart illustrating an example of storing data in accordance with the present invention.

FIG. 7B is a flowchart illustrating an example of storing data. The method begins at step 130 where a processing module (e.g., of a computing device) encodes data utilizing a dispersed storage error coding function to produce a set of encoded data slices, wherein the dispersed storage error coding function includes a decode threshold parameter and a pillar width parameter. The encoding the data further includes establishing the decode threshold parameter and the pillar width parameter based on one or more of physical characteristics of the local memory and a local memory performance characteristic. Alternatively, or in addition to, the processing module encodes the data utilizing the dispersed storage error coding function to produce a plurality of sets of encoded data slices, which includes the set of encoded data slices.

The method continues at step 132 where the processing module determines the number of encoded data slices by at least one of performing a mathematical function on the decode threshold parameter and performing a second mathematical function based on at least one of physical structure of the local memory and performance characteristics of the local memory. Alternatively, or in addition to, the processing module determines, in accordance with a set storage protocol, the number of encoded data slices of one or more sets of the plurality of sets of encoded data slices when the data is encoded to produce the plurality of sets of encoded data slices.

The method continues at step 134 where the processing module stores a number of encoded data slices of the set of encoded data slices in a local memory, wherein the number is based on the decode threshold parameter and is less than the pillar width parameter. The storing the number of encoded data slices further includes selecting the number of encoded data slices from the set of encoded data slices based on the dispersed storage error coding function and issuing a number of write requests to the local memory for the number of encoded data slices.

The method continues at step 136 where the processing module outputs remaining encoded data slices of the set of encoded data slices to dispersed storage network (DSN) memory. The outputting remaining encoded data slices further includes sending the remaining encoded data slices to a dispersed storage processing unit or sending the data and the number to a dispersed storage (DS) processing unit, wherein the DS processing unit encodes the data utilizing the dispersed storage error coding function to produce another set of encoded data slices, identifying the remaining encoded data slices from the other set of encoded data slices based on the number and the a set by set basis, for the plurality, or for groupings of the plurality and outputting the remaining encoded data slices to the DSN memory; and updating an encoded data slice mapping. The outputting remaining encoded data slices further includes selecting one or more of selecting a memory of the DSN memory based on one or more DSN memory performance characteristics, sending a write encoded data slice request to the at least one memory for each encoded data slice of the remaining encoded data slices, wherein each write encoded data slice request includes a corresponding encoded data slice of the remaining encoded data slices, and updating an encoded data slice mapping.

Figure 7C:
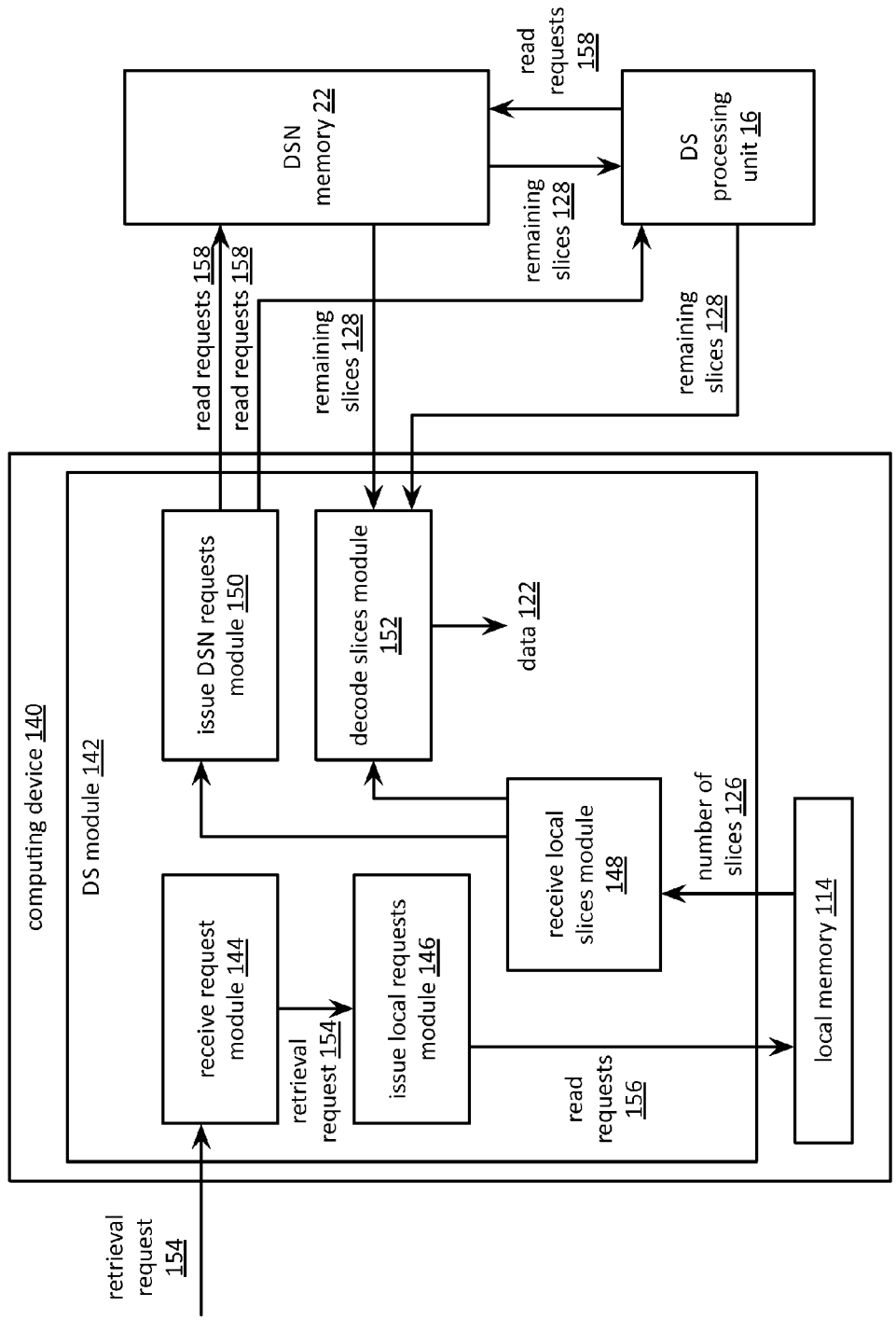
FIG. 7C is a schematic block diagram of another embodiment of a computing system in accordance with the present invention.

FIG. 7C is a schematic block diagram of another embodiment of a computing system that includes a computing device 140, a dispersed storage (DS) processing unit 16, and a dispersed storage network (DSN) memory 22. The DSN memory 22 includes one or more of a secondary magnetic drive memory, a computing device memory, a user device memory, and at least one set of DS units. The computing device 140 includes a DS module 142 and a local memory 114. The local memory 114 may include one or more memory devices, wherein each memory device includes one or more of a flash memory 102, a magnetic drive memory 104, a primary magnetic drive memory, a computing device memory, a local user device memory, a solid-state memory, and an optical memory. Alternatively, the local memory 114 may include memory associated with two or more computing devices 140. The DS module 142 includes a receive request module 144, an issue local requests module 146, receive local slices module 148, an issue DSN requests module 150, and a decode slices module 152. The receive request module 144, when operable within the computing device 140, causes the computing device 140 to receive a retrieval request 154 for data 122, wherein the data 122 is encoded utilizing a dispersed storage error coding function to produce a set of encoded data slices 124, wherein a number of encoded data slices 126 of the set of encoded data slices 124 are stored in the local memory 114 and remaining encoded data slices 128 of the set of encoded data slices 124 are stored in the DSN memory 22.

The issue local requests module 146, when operable within the computing device 140, causes the computing device 140 to issue a number of data read requests 156 to the local memory 114 for retrieval of the number of encoded data slices 126. The issue local requests module 146 functions to issue the number of data read requests 156 by determining the number of data read requests 156 by at least one of performing a number look up operation (e.g., from a previous storage sequence), performing a mathematical function on a decode threshold parameter, and performing a second mathematical function based on at least one of physical structure of the local memory and performance characteristics of the local memory, wherein the dispersed storage error coding function includes a decode threshold parameter and a pillar width parameter.

The receive local slices module 148, when operable within the computing device 140, causes the computing device 140 to determine whether a decode threshold number of encoded data slices have been received from the local memory 114. The receive local slices module 148 functions to determine whether a decode threshold number of encoded data slices have been received by one of determining that the decode threshold number of encoded data slices have not been received when the number of data read requests 156 is less than a decode threshold parameter and when the number of data read requests 156 is greater than or equal to the decode threshold parameter decode threshold, determining whether the decode threshold number of encoded data slices have been received within a given time frame.

When the decode threshold number of encoded data slices have not been received (e.g., within a time period) from the local memory 114, the issue DSN requests module 150, when operable within the computing device 140, causes the computing device 140 to issue one or more data read requests 158 to the DSN memory 22 (e.g., directly to the DSN memory 22 or via the DS processing unit 16) for retrieving one or more of the remaining encoded data slices 128. The issue DSN requests module 150 functions to issue the one or more data read requests 158 to the DSN memory 22 by selecting the one or more of the remaining encoded data slices 128 based on one or more of an encoded data slice mapping retrieval, a query, a message, and the data retrieval request. In addition, the issue DSN requests module 150 sends the one or more data read requests 158 to the DSN memory 22. When the decode threshold number of encoded data slices have been received (e.g., directly from the DSN memory 22 to the decode slices module 152 or via the DS processing unit 16), the decode slices module 152, when operable within the computing device 140, causes the computing device 140 to decode the decode threshold number of encoded data slices using the dispersed storage error coding function to reproduce the data 122.

Figure 7D:
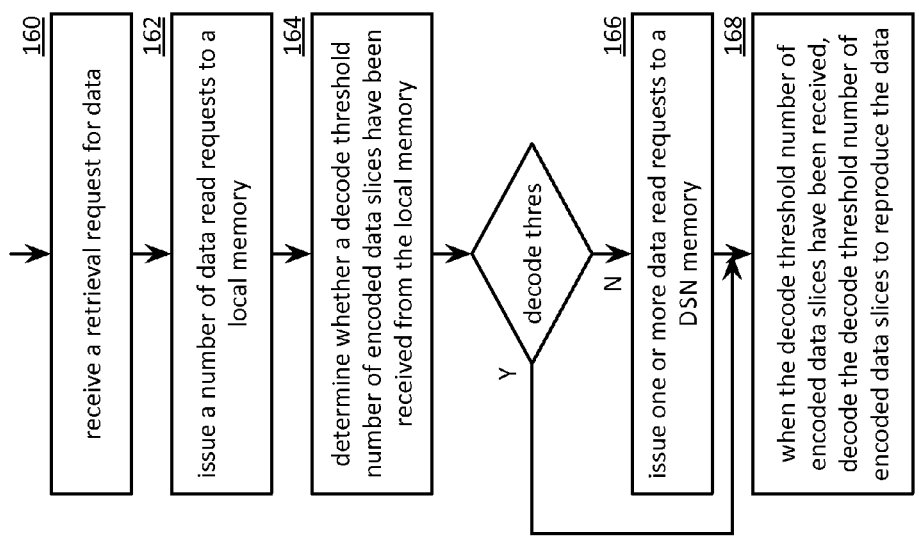
FIG. 7D is a flowchart illustrating an example of retrieving data in accordance with the present invention.

FIG. 7D is a flowchart illustrating an example of retrieving data. The method begins at step 160 where a processing module (e.g., of a computing device) receives a retrieval request for data, wherein the data is encoded utilizing a dispersed storage error coding function to produce a set of encoded data slices, wherein a number of encoded data slices of the set of encoded data slices are stored in a local memory and remaining encoded data slices of the set of encoded data slices are stored in dispersed storage network (DSN) memory.

The method continues at step 162 where the processing module issues a number of data read requests to the local memory for retrieval of the number of encoded data slices. The issuing the number of data read requests includes determining the number of data read requests by at least one of performing a number look up operation, performing a mathematical function on a decode threshold parameter, and performing a second mathematical function based on at least one of physical structure of the local memory and performance characteristics of the local memory, wherein the dispersed storage error coding function includes a decode threshold parameter and a pillar width parameter.

The method continues at step 164 where the processing module determines whether a decode threshold number of encoded data slices have been received from the local memory. The determining whether a decode threshold number of encoded data slices have been received includes one of determining that the decode threshold number of encoded data slices have not been received when the number of data read requests is less than a decode threshold parameter and when the number of data read requests is greater than or equal to the decode threshold parameter decode threshold, determining whether the decode threshold number of encoded data slices have been received within a given time frame. The method branches to step 168 when the processing module determines that the decode threshold number of encoded data slices have been received. The method continues to step 166 when the processing module determines that the decode threshold number of encoded data slices have not been received (e.g., within a given time period).

The method continues at step 166 where the processing module issues one or more data read requests to the DSN memory for retrieving one or more of the remaining encoded data slices. The issuing the one or more data read requests to the DSN memory includes selecting the one or more of the remaining encoded data slices based on one or more of an encoded data slice mapping retrieval, a query, a message, and the data retrieval request. When the decode threshold number of encoded data slices have been received, the method continues at step 168 where the processing module decodes the decode threshold number of encoded data slices using the dispersed storage error coding function to reproduce the data.

Figure 8A:
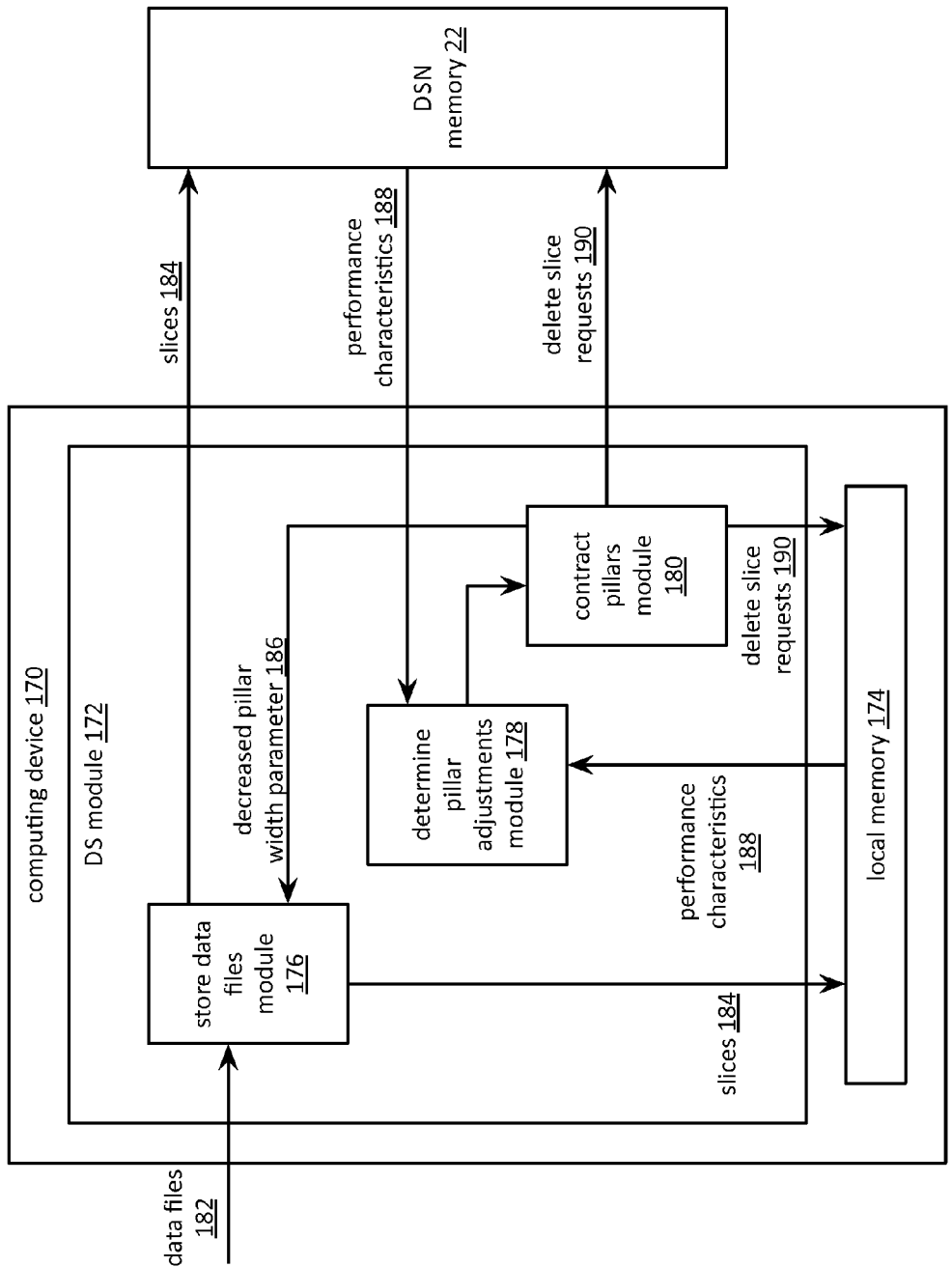
FIG. 8A is a schematic block diagram of another embodiment of a computing system in accordance with the present invention.

FIG. 8A is a schematic block diagram of another embodiment of a computing system that includes a computing device 170 and a dispersed storage network (DSN) memory 22. The DSN memory 22 includes one or more of a secondary magnetic drive memory, a computing device memory, a user device memory, and at least one set of DS units. The computing device 170 includes a DS module 172 and a local memory 174. The local memory 174 may include one or more memory devices, wherein each memory device includes one or more of a flash memory 102, a magnetic drive memory 104, a primary magnetic drive memory, a computing device memory, a local user device memory, a solid-state memory, and an optical memory. The DS module 172 includes a store data files module 176, a determine pillar adjustment module 178, and a contract pillars module 180.

The store data files module 176, when operable within the computing device 170, causes the computing device 170 to store data files 182 utilizing a dispersed storage error coding function, wherein a data file of the data files is encoded using the dispersed storage error coding function to produce a plurality of sets of encoded data slices 184, wherein the plurality of sets of encoded data slices 184 is stored in memory, and wherein the dispersed storage error coding function includes a pillar width parameter and a decode threshold parameter, where the pillar width parameter is at least 1.8 times the decode threshold parameter (e.g., a pillar width parameter of 100 and a decode threshold parameter of 10). The memory includes one or more of the local memory 174 and the DSN memory 22. The store data files module 176, when operable within the computing device 170, further causes the computing device 170 to encode a subsequent data file utilizing a decreased pillar width parameter 186 (e.g., 60), the decode threshold parameter, and the dispersed storage error coding function to produce a subsequent plurality of sets of encoded data slices and store the subsequent plurality of sets of encoded data slices in the memory.

The determine pillar adjustment module 178, when operable within the computing device 170, causes the computing device 170 to determine whether to adjust the pillar width parameter based one or more memory performance characteristics 188 (e.g., availability and/or reliability). The determine pillar adjustment module 178 functions to determine to decrease the pillar width parameter by determining a memory utilization indicator associated with the memory (e.g., includes obtaining the memory utilization indicator based on one or more of a lookup, a query, a test, and receiving a message), determining a memory reliability indicator associated with the memory, and when the memory utilization indicator is unfavorable and the memory reliability indicator is favorable, indicating a decrease of the pillar width parameter. The memory utilization indicator includes one or more of an amount of available memory, an amount of utilized memory, available memory percentage of memory capacity, and utilized memory percentage of memory capacity. The memory reliability indicator includes one or more of an access latency level of the local memory, a rebuilding frequency indicator, and a data retrieval reliability level of the memory. For example, the determine pillar adjustment module 178 decreases the pillar width parameter from 100 to 60 when an amount of utilized memory is greater than a memory threshold and a data retrieval reliability level compares favorably to a reliability threshold.

When the pillar width parameter is to be decreased, the contract pillars module 180, when operable within the computing device 170, causes the computing device 170 to identify one or more pillars within the memory to delete to produce one or more identified pillars (e.g., and produce the decreased pillar width parameter 186), identify encoded data slices of one or more of the data files stored in the one or more identified pillars to produce identified encoded data slices, and delete the identified encoded data slices (e.g., by sending delete encoded data slice requests 190 to the DSN memory 22 with regards to the identified encoded data slices). The contract pillars module 180 functions to identify the one or more pillars within the memory to delete by determining an amount of memory space to reclaim based on at least one of a memory utilization indicator and a memory reliability indicator, identifying one or more of the data files based on data file criteria (e.g., user identifier, minimum file size, a file priority indicator), and determining a number of pillars to be deleted based on the amount of memory space to reclaim and the identified one or more of the data files. For example, the contract pillars module 180 identifies pillars 61-100 to delete corresponding to 50 data files associated with a lower than average file priority indicator value to reclaim 100 GB of memory space.

The contract pillars module 180 functions to delete the identified encoded data slices by reclaiming memory space of the deleted encoded data slices and updating pillar mapping of the memory in accordance with the decreasing of the pillar width parameter and the reclaimed memory space (e.g., reassign slice name ranges per memory). The contract pillars module 180 functions to identify the encoded data slices by identifying the one or more of the data files (e.g., based on file priority) and for each of the one or more identified data files determining which of the encoded data slices of a respective plurality of sets of encoded data slices are stored in the one or more identified pillars to produce data file specific encoded data slices, wherein the identified encoded data slices includes the data file specific encoded data slices for each of the one or more identified data files.

Figure 8B:
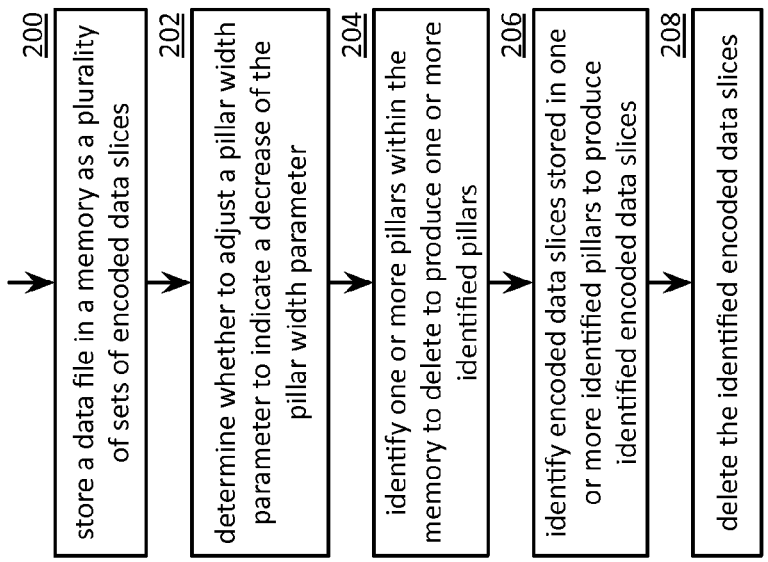
FIG. 8B is a flowchart illustrating an example of contracting data storage in accordance with the present invention.

FIG. 8B is a flowchart illustrating an example of contracting data storage. The method begins at step 200 where a processing module (e.g., of a computing device) stores data files utilizing a dispersed storage error coding function, wherein a data file of the data files is encoded using the dispersed storage error coding function to produce a plurality of sets of encoded data slices, wherein the plurality of sets of encoded data slices is stored in memory, and wherein the dispersed storage error coding function includes a pillar width parameter and a decode threshold parameter, where the pillar width parameter is at least 1.8 times the decode threshold parameter. The memory includes one or more of a local memory and a dispersed storage network (DSN) memory. Alternatively, or in addition to, processing module encodes a subsequent data file utilizing the decreased pillar width parameter, the decode threshold parameter, and the dispersed storage error coding function to produce a subsequent plurality of sets of encoded data slices and stores the subsequent plurality of sets of encoded data slices in the memory.

The method continues at step 202 where the processing module determines whether to adjust the pillar width parameter based on one or more memory performance characteristics. The determining to decrease the pillar width parameter includes determining a memory utilization indicator associated with the memory, determining a memory reliability indicator associated with the memory, and when the memory utilization indicator is unfavorable and the memory reliability indicator is favorable, indicating a decrease of the pillar width parameter.

When the pillar width parameter is to be decreased, the method continues at step 204 where the processing module identifies one or more pillars within the memory to delete to produce one or more identified pillars. The identifying one or more pillars within the memory to delete includes determining an amount of memory space to reclaim based on at least one of a memory utilization indicator and a memory reliability indicator, identifying one or more of the data files based on data file criteria, and determining a number of pillars to be deleted based on the amount of memory space to reclaim and the identified one or more of the data files.

The method continues at step 206 where the processing module identifies encoded data slices of one or more of the data files stored in the one or more identified pillars to produce identified encoded data slices. The identifying encoded data slices includes identifying the one or more of the data files and for each of the one or more identified data files, determining which of the encoded data slices of a respective plurality of sets of encoded data slices are stored in the one or more identified pillars to produce data file specific encoded data slices, wherein the identified encoded data slices includes the data file specific encoded data slices for each of the one or more identified data files.

The method continues at step 208 where the processing module deletes the identified encoded data slices. The deleting the identified encoded data slices includes reclaiming memory space of the deleted encoded data slices and updating pillar mapping of the memory in accordance with the decreasing of the pillar width parameter and the reclaimed memory space.

Figure 9A:
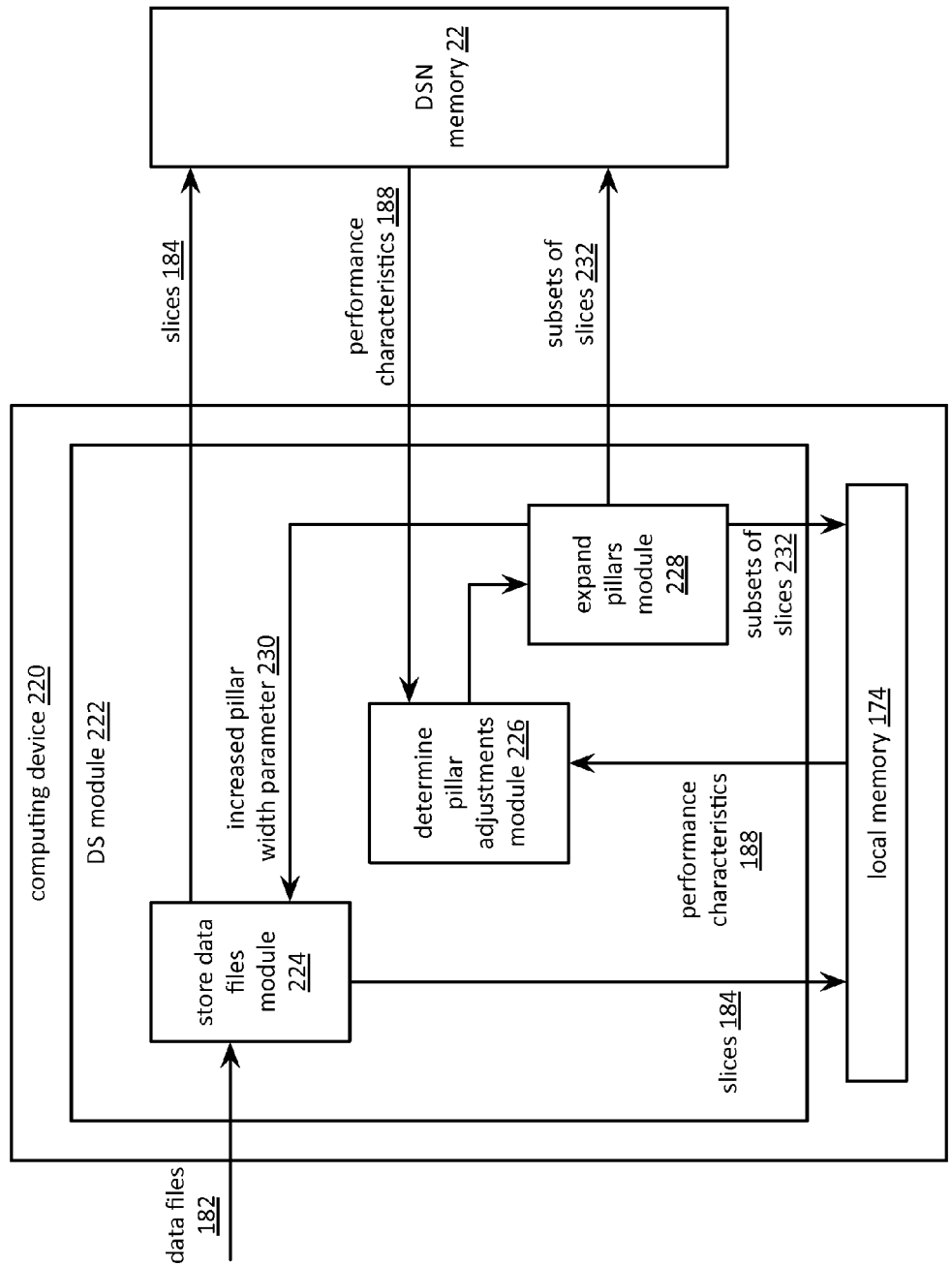
FIG. 9A is a schematic block diagram of another embodiment of a computing system in accordance with the present invention.

FIG. 9A is a schematic block diagram of another embodiment of a computing system that includes a computing device 220 and a dispersed storage network (DSN) memory 22. The DSN memory 22 includes one or more of a secondary magnetic drive memory, a computing device memory, a user device memory, and at least one set of DS units. The computing device 220 includes a DS module 222 and a local memory 174. The local memory 174 may include one or more memory devices, wherein each memory device includes one or more of a flash memory 102, a magnetic drive memory 104, a primary magnetic drive memory, a computing device memory, a local user device memory, a solid-state memory, and an optical memory. The DS module 222 includes a store data files module 224, a determine pillar adjustment module 226, and an expand pillars module 228.

The store data files module 224, when operable within a computing device 220, causes the computing device 220 to store data files 182 utilizing a dispersed storage error coding function, wherein a data file of the data files is encoded using the dispersed storage error coding function to produce a plurality of sets of encoded data slices 184, wherein the plurality of sets of encoded data slices is stored in memory, and wherein the dispersed storage error coding function includes a pillar width parameter and a decode threshold parameter, where the pillar width parameter is greater than the decode threshold parameter (e.g., a pillar width parameter of 20 and a decode threshold parameter of 10). The memory includes one or more of the local memory 174 and a DSN memory 22. The store data files module 224, when operable within the computing device 220, further causes the computing device 220 to encode a subsequent data file utilizing an increased pillar width parameter 230 (e.g., 60), the decode threshold parameter, and the dispersed storage error coding function to produce a subsequent plurality of sets of encoded data slices and store the subsequent plurality of sets of encoded data slices in the memory.

The determine pillars adjustment module 226, when operable within the computing device 220, causes the computing device 220 to determine whether to adjust the pillar width parameter based one or more memory performance characteristics 188 (e.g., memory availability and/or memory reliability). The determine pillar adjustment module 226, when operable within the computing device 220, further causes the computing device 220 to determine to increase the pillar width parameter by one or more of determining a memory utilization indicator associated with the memory, determining a memory reliability indicator associated with the memory, and when the memory utilization indicator is favorable and the memory reliability indicator is unfavorable, indicating an increase of the pillar width parameter. The memory utilization indicator includes one or more of an amount of available memory, an amount of utilized memory, available memory percentage of memory capacity, and utilized memory percentage of memory capacity. The memory reliability indicator includes one or more of an access latency level of the local memory, a rebuilding frequency indicator, and a data retrieval reliability level of the memory. For example, the determine pillar adjustment module 226 increases the pillar width parameter from 20 to 60 when an amount of utilized memory is less than a memory threshold and a data retrieval reliability level compares unfavorably to a reliability threshold.

When the pillar width parameter is to be increased, the expand pillars module 228, when operable within the computing device 220, causes the computing device 220 to determine a number of additional pillars to produce the increased pillar width parameter 230, identify one or more of the data files based on data file criteria (e.g., by a user identifier, a priority indicator), and for each of the one or more data files encode a data file of the one or more data files utilizing the increased pillar width parameter, the decode threshold parameter, and the dispersed storage error coding function to produce a plurality of subsets of encoded data slices 232 relating to the number of additional pillars (e.g., retrieve data from a decode threshold number of slices, and use new rows of an extended generator matrix to produce the plurality of subsets of encoded data slices), and store the plurality of subsets of encoded data slices 232 in the memory corresponding to the additional pillars.

The expand pillars module 228, when operable within the computing device, further causes the computing device to determine the number of additional pillars by one or more of determining a level of unfavorability of the memory reliability indicator and determining the number of additional pillars based on the level of unfavorability. For example, the expand pillars module 228 determines 40 additional pillars (e.g., 21-60) when a level of memory reliability is much lower than a low reliability threshold. The expand pillars module 228 further functions to store the plurality of subsets of encoded data slices 232 by updating pillar mapping of the memory in accordance with the increasing of the pillar width parameter (e.g., wider slice name range assigned to memory).

Figure 9B:
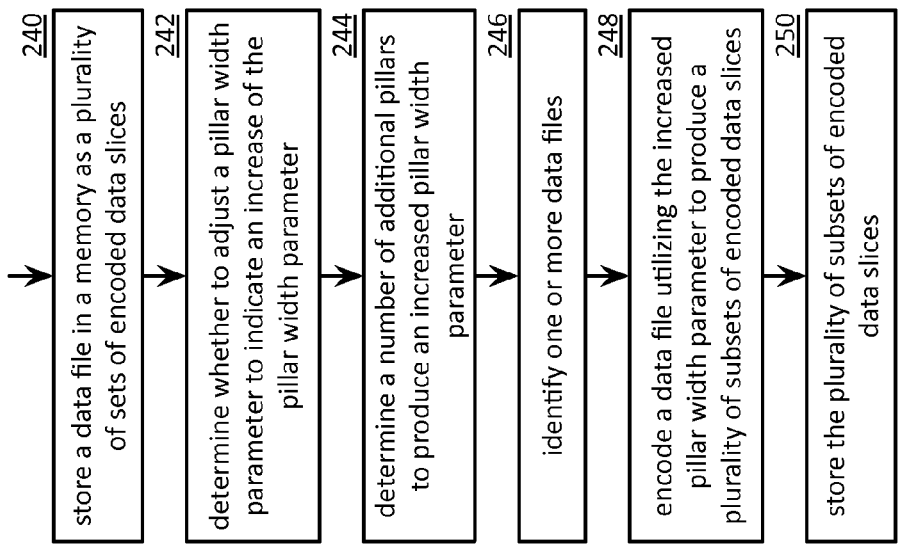
FIG. 9B is a flowchart illustrating an example of expanding data storage in accordance with the present invention.

FIG. 9B is a flowchart illustrating an example of expanding data storage. The method begins at step 240 where a processing module (e.g., of a computing device) stores data files utilizing a dispersed storage error coding function, wherein a data file of the data files is encoded using the dispersed storage error coding function to produce a plurality of sets of encoded data slices, wherein the plurality of sets of encoded data slices is stored in memory, and wherein the dispersed storage error coding function includes a pillar width parameter and a decode threshold parameter, where the pillar width parameter is greater than the decode threshold parameter. The memory includes one or more of a local memory and a dispersed storage network (DSN) memory. Alternatively, or in addition to, the processing module encodes a subsequent data file utilizing an increased pillar width parameter, the decode threshold parameter, and the dispersed storage error coding function to produce a subsequent plurality of sets of encoded data slices and stores the subsequent plurality of sets of encoded data slices in the memory.

The method continues at step 242 where the processing module determines whether to adjust the pillar width parameter based one or more memory performance characteristics (e.g., memory availability and/or memory reliability). The determining to increase the pillar width parameter includes determining a memory utilization indicator associated with the memory, determining a memory reliability indicator associated with the memory, and when the memory utilization indicator is favorable and the memory reliability indicator is unfavorable, indicating an increase of the pillar width parameter.

When the pillar width parameter is to be increased, the method continues at step 244 where the processing module determines a number of additional pillars to produce an increased pillar width parameter. The determining the number of additional pillars includes determining a level of unfavorability of the memory reliability indicator and determining the number of additional pillars based on the level of unfavorability. The method continues at step 246 where the processing module identifies one or more of the data files based on data file criteria (e.g., based on a user identifier, a priority indicator). For example, the processing module identifies 1000 data files that are associated with a high priority indicator associated with a requirement for high data retrieval reliability.

For each of the one or more data files, the method continues at step 248 where the processing module encodes a data file of the one or more data files utilizing the increased pillar width parameter, the decode threshold parameter, and the dispersed storage error coding function to produce a plurality of subsets of encoded data slices relating to the number of additional pillars (e.g., retrieve data from a decode threshold number of encoded data slices retrieved from the memory, matrix multiply the data by new rows of an extended generator matrix to produce the plurality of subsets of encoded data slices). The method continues at step 250 where the processing module stores the plurality of subsets of encoded data slices in the memory corresponding to the additional pillars. The storing the plurality of subsets of encoded data slices includes updating pillar mapping of the memory in accordance with the increasing of the pillar width parameter (e.g., wider slice name range assigned to memory).

Figure 10A:
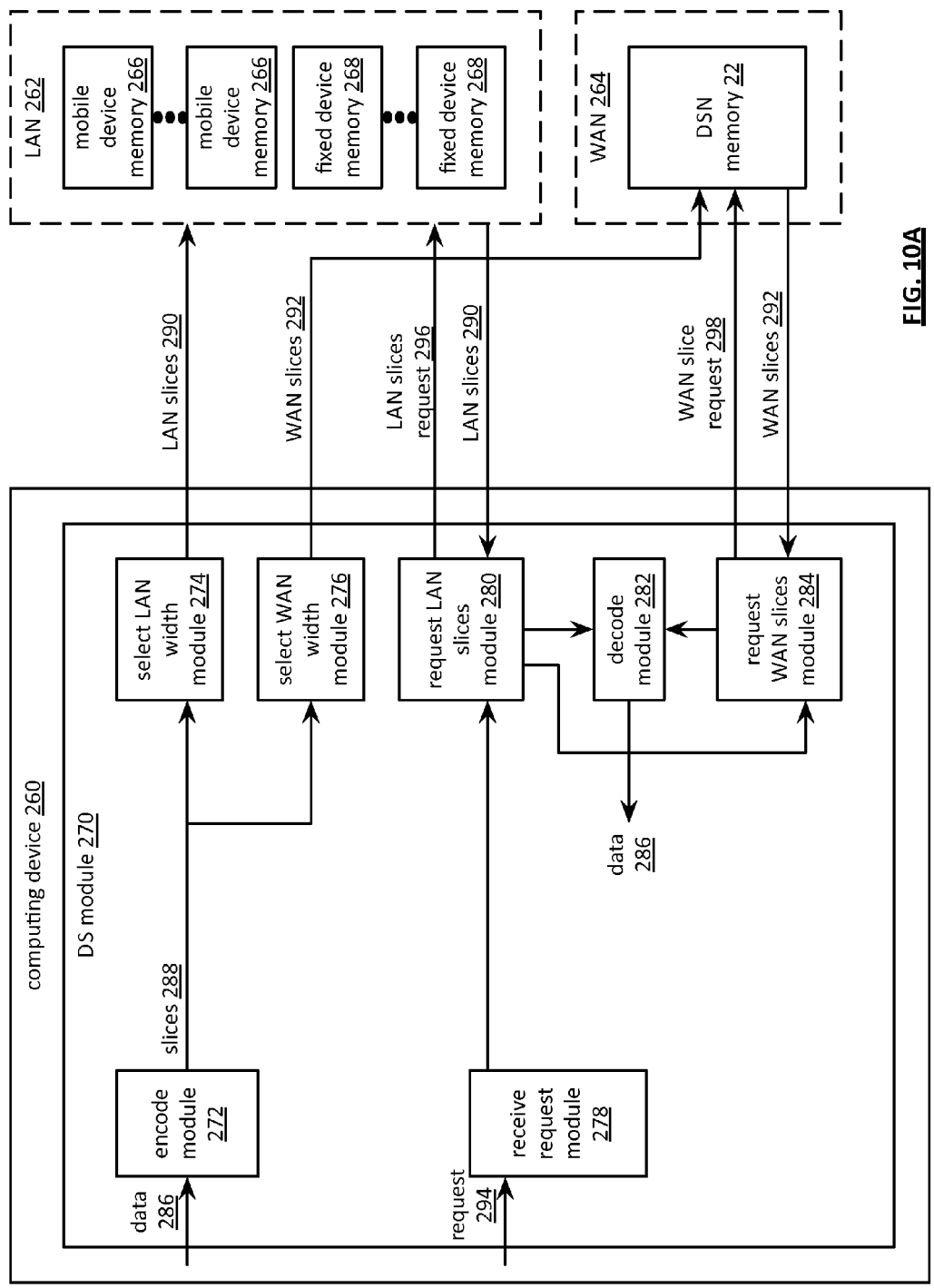
FIG. 10A is a schematic block diagram of another embodiment of a computing system in accordance with the present invention.

FIG. 10A is a schematic block diagram of another embodiment of a computing system that includes a computing device 260, a local area network (LAN) 262, and a wide area network (WAN) 264. The WAN 264 includes a dispersed storage network (DSN) memory 22. The DSN memory 22 includes one or more of a secondary magnetic drive memory, a computing device memory, a user device memory, and at least one set of DS units. The LAN 262 includes a plurality of mobile device memories 266 and a plurality of fixed device memories 268. The fixed device memory 268 is substantially permanently associated with the LAN 262 whereas the mobile device memory 266 may become disassociated with the LAN 262 from time to time. For example, a first mobile device memory 266 includes a smart phone that is utilized in association with the LAN 262 when the first mobile device 266 is proximally associated with a LAN 262. As another example, a first fixed device memory 268 is associated with a cable set-top box of a home based LAN 262. The mobile device memory 266 and the fixed device memory 268 may include one or more memory devices, wherein each memory device includes one or more of a flash memory 102, a magnetic drive memory 104, a primary magnetic drive memory, a computing device memory, a local device memory, a solid-state memory, and an optical memory.

The mobile device memory 266 includes mobile device available memory 266 when at least some of the one or more memory devices associated with the mobile device memory 266 are available for storage access. The fixed device memory 268 includes fixed device available memory 268 when at least some of the one or more memory devices associated with the fixed device memory 268 are available for storage access. The computing device 260 includes a dispersed storage (DS) module 270 and may include one or more of the mobile device memory 266 and the fixed device memory 268. The DS module 270 includes an encode module 272, a select LAN width module 274, a select WAN width module 276, a receive request module 278, a request LAN slices module 280, a decode module 282, and a request WAN slices module 284.

The encode module 272, when operable within the computing device 260, causes the computing device 260 to encode, in accordance with a dispersed storage error coding function, data 286 based on a decode threshold parameter and a pillar width parameter to produce a set of encoded data slices 288. The encode module 272 further functions to encode the data 286 by determining the decode threshold parameter based on a minimum quantity of the fixed device available memory 268 and determining the pillar width parameter based on the minimum quantity of the fixed device available memory 268 and a minimum quantity of the mobile device available memory 266. For example, the encode module 272 determines the decode threshold parameter to be 3 when a quantity of the fixed device available memory 268 is 3 fixed devices 268. As another example, the encode module 272 determines the decode threshold parameter to be 10 when a quantity of the fixed device available memory 268 is 15 fixed devices 268 and a decode threshold parameter minimum number is 10. As yet another example, the encode module 272 determines the pillar width parameter to be 5 when the quantity of the fixed device available memory 268 is 3 fixed devices 268 and a quantity of the mobile device available memory 266 is 3. As a still further example, the encode module 272 determines the pillar width parameter to be 16 when the quantity of the fixed device available memory 268 is 15 fixed devices 268, a quantity of the mobile device available memory 266 is 12, and a pillar width parameter minimum number is 16.

The select LAN width module 274, when operable within the computing device 260, causes the computing device 260 to select a local area network (LAN) pillar width value of encoded data slices 290 of the set of encoded data slices 288 for storage in LAN available memories (e.g., available mobile device memories 266 and/or available fixed device memories 268), wherein the LAN pillar width value is based on the decode threshold parameter, the pillar width parameter, and quantities of the LAN available memories and wherein the LAN pillar width value is equal to or greater than a value of the decode threshold parameter. The LAN available memories includes mobile device available memory 266 and fixed device available memory 268. The select LAN width module 274 may select the LAN pillar width value as less than a value of the pillar width parameter. For example the select LAN width module 274 selects a LAN pillar width value of 12 when the pillar width parameter is 16.

The select WAN width module 276, when operable within the computing device 260, causes the computing device 260 to select a wide area network (WAN) pillar width value of encoded data slices 292 of the set of encode data slices 288 for storage in the DSN memory 22 of the wide area network 264, wherein the WAN pillar width value is based on the decode threshold parameter and the pillar width parameter and wherein the WAN pillar width value is equal to or greater than the value of the decode threshold parameter. The select WAN width module 276 may select the WAN pillar width value as less than a value of the pillar width parameter. For example the select WAN width module 276 selects a WAN pillar width value of 12 when the pillar width parameter is 16.

The receive request module 278, when operable within the computing device 260, causes the computing device 260 to receive a request 294 to retrieve the data 286. The request LAN slices module 280, when operable within the computing device 260, causes the computing device 260 to determine whether the LAN is accessible (e.g., based on a query to one or more mobile device memories 266 and/or one or more fixed device memories 268), and when the LAN is accessible, request the LAN pillar width value of encoded data slices from the LAN memories (e.g., sending LAN slices requests 296 to the LAN memories). For example, the request LAN slices module 280 sends 12 LAN slice requests 296 to the LAN memories when a LAN pillar width value is 12.

The decode module 282, when operable within the computing device 260, causes the computing device 260 to, when at least a decode threshold parameter of the LAN pillar width value of encoded data slices 290 have been received, decode, in accordance with the dispersed storage error coding function to produce the data 286. The request WAN slices module 284, when operable within the computing device 260, causes the computing device 260 to, when the at least the decode threshold parameter of the LAN pillar width value of encoded data slices have not been received, request at least one of the WAN pillar width value of encoded data slices 292 from the DSN memory 22 (e.g., via at least one WAN slice request 298). For example, the request WAN slices module 284 sends three WAN slice requests 298 to the DSN memory 22 when the decode threshold parameter is 10 and 7 LAN slices 290 have been received. When the LAN 262 is not accessible, the request WAN slices module 284 requests the WAN pillar width value of encoded data slices 292 from the DSN memory 22. For example, the request WAN slices module 284 sends 12 WAN slice requests 298 to the DSN memory 22 when the LAN 262 is not accessible.

Figure 10B:
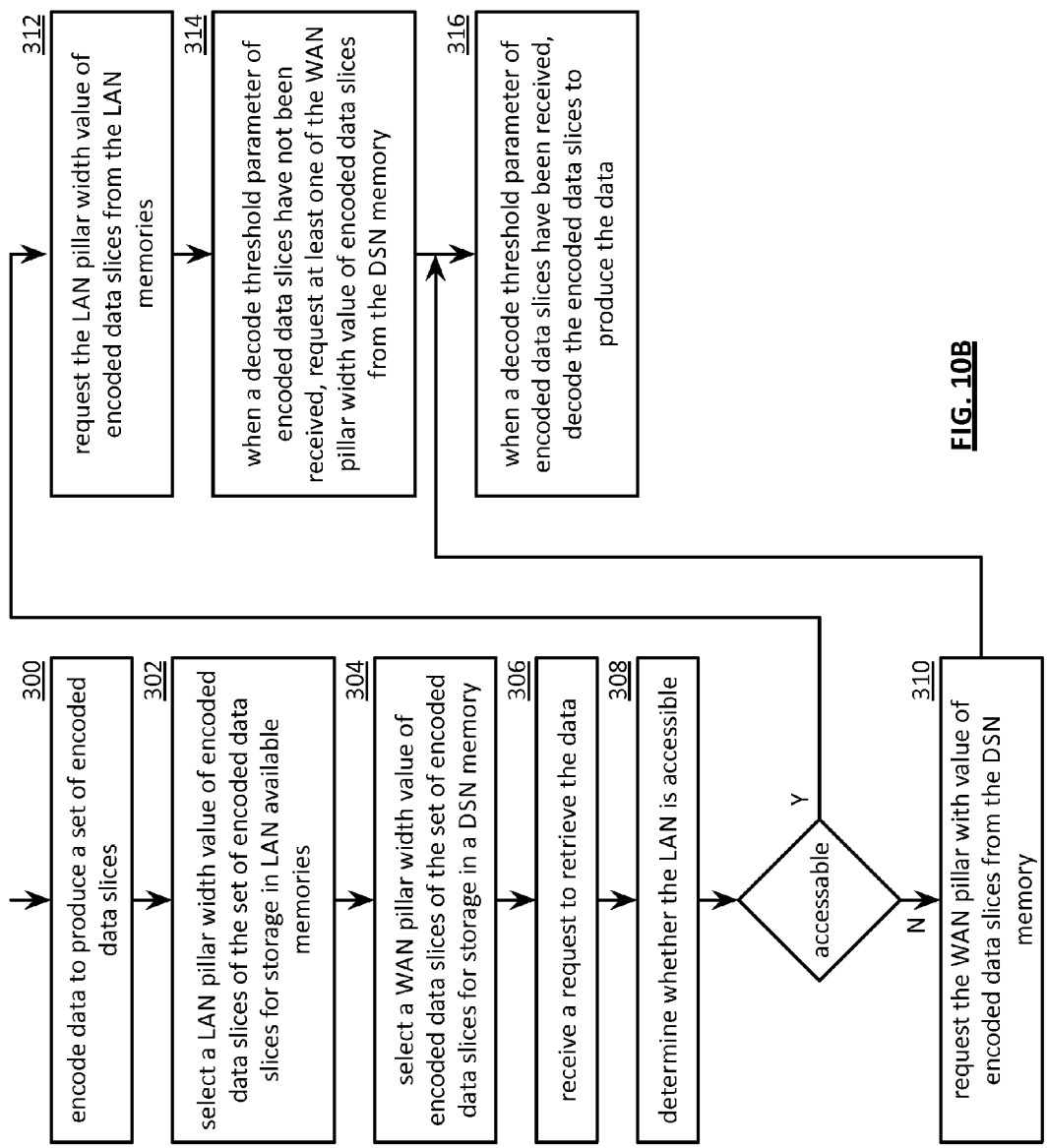
FIG. 10B is a flowchart illustrating an example of accessing data in accordance with the present invention.

FIG. 10B is a flowchart illustrating an example of accessing data. The method begins at step 300 where a processing module (e.g., of a computing device) encodes, in accordance with a dispersed storage error coding function, data based on a decode threshold parameter and a pillar width parameter to produce a set of encoded data slices. The encoding the data includes determining the decode threshold parameter based on a minimum quantity of the fixed device available memory and determining the pillar width parameter based on the minimum quantity of the fixed device available memory and a minimum quantity of the mobile device available memory.

The method continues at step 302 where the processing module selects a local area network (LAN) pillar width value of encoded data slices of the set of encoded data slices for storage in LAN available memories, wherein the LAN pillar width value is based on the decode threshold parameter, the pillar width parameter, and quantities of the LAN available memories and wherein the LAN pillar width value is equal to or greater than a value of the decode threshold parameter. The LAN available memories includes mobile device available memory and fixed device available memory. The LAN pillar width value may be less than a value of the pillar width parameter to provide data retrieval capability without utilizing LAN memories to store all the slices.

The method continues at step 304 where the processing module selects a wide area network (WAN) pillar width value of encoded data slices of the set of encode data slices for storage in a dispersed storage network (DSN) memory of a wide area network, wherein the WAN pillar width value is based on the decode threshold parameter and the pillar width parameter and wherein the WAN pillar width value is equal to or greater than the value of the decode threshold parameter. The WAN pillar width value may be less than a value of the pillar width parameter to provide data retrieval capability without utilizing the DSN memory to store all the slices.

The method continues at step 306 where the processing module receives a request to retrieve the data. The method continues at step 308 where the processing module determines whether the LAN is accessible. For example, the processing module initiates a query to a memory device associated with the LAN. The method branches to step 312 when the processing module determines that the LAN is accessible. The method continues to step 310 when the processing module determines that the LAN is not accessible. The method continues at step 310 where the processing module requests the WAN pillar width value of encoded data slices from the DSN memory when the LAN is not accessible. The method branches to step 316.

The method continues at step 312 where the processing module requests the LAN pillar width value of encoded data slices from the LAN memories when the LAN is accessible. When the at least the decode threshold parameter of the LAN pillar width value of encoded data slices have not been received, the method continues at step 314 where the processing module requests at least one (e.g., enough to provide a decode threshold number of encoded data slices) of the WAN pillar width value of encoded data slices from the DSN memory. The method continues at step 316, when at least a decode threshold parameter of the LAN pillar width value of encoded data slices have been received, where the processing module decodes, in accordance with the dispersed storage error coding function to produce the data.

Figure 10C:
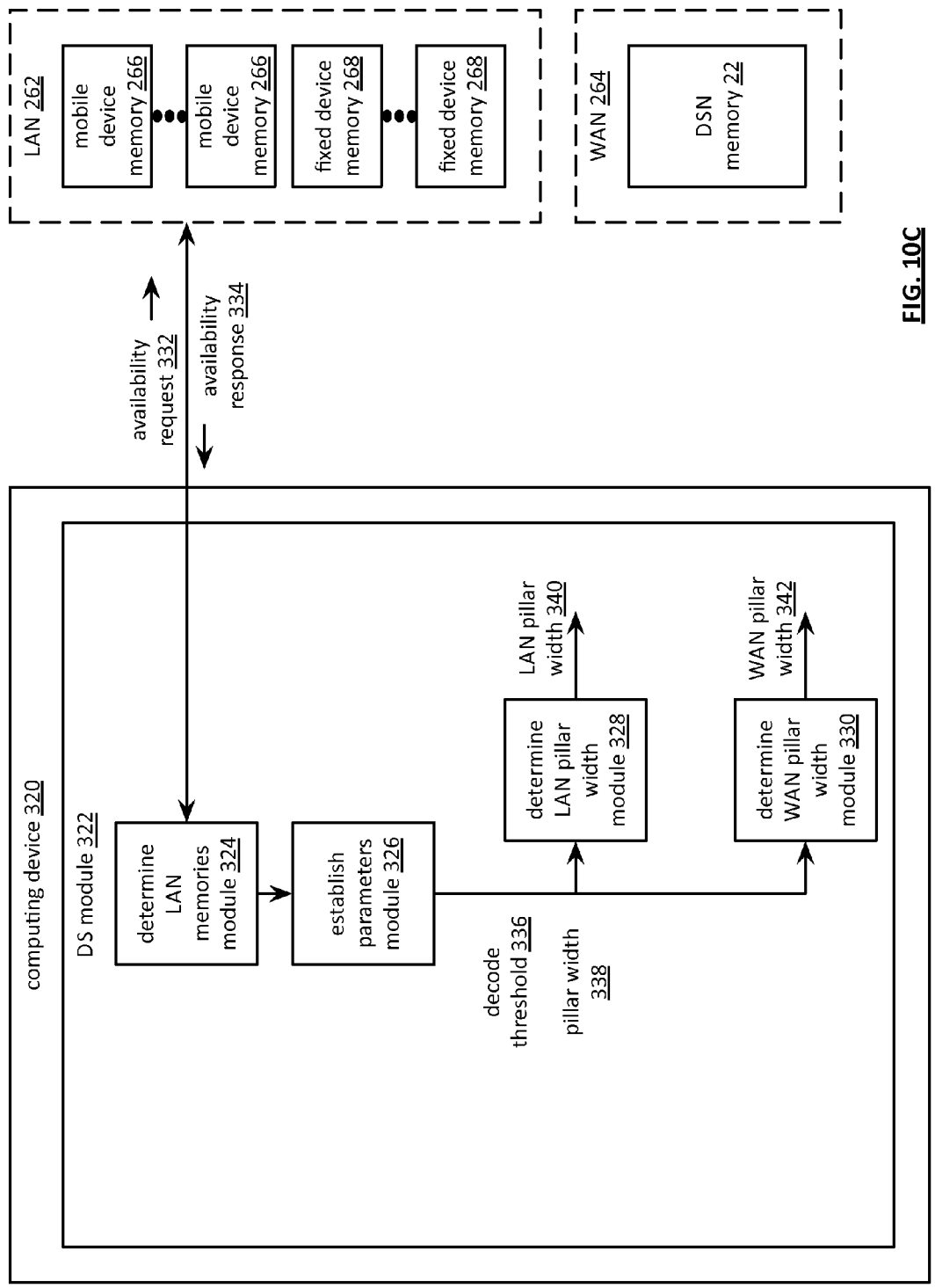
FIG. 10C is a schematic block diagram of another embodiment of a computing system in accordance with the present invention.

FIG. 10C is a schematic block diagram of another embodiment of a computing system that includes a computing device 320, a local area network (LAN) 262, and a wide area network (WAN) 264. The WAN 264 includes a dispersed storage network (DSN) memory 22. The DSN memory 22 includes one or more of a secondary magnetic drive memory, a computing device memory, a user device memory, and at least one set of DS units. The LAN 262 includes a plurality of mobile device memories 266 and a plurality of fixed device memories 268. For example, a laptop computer includes a mobile device memory 266. As another example, desktop computer includes a fixed device memory 268. The mobile device memory 266 and the fixed device memory 268 may include one or more memory devices, wherein each memory device includes one or more of a flash memory 102, a magnetic drive memory 104, a primary magnetic drive memory, a computing device memory, a local device memory, a solid-state memory, and an optical memory.

The mobile device memory 266 includes mobile device available memory 266 when at least some of the one or more memory devices associated with the mobile device memory 266 are available for storage access. The fixed device memory 268 includes fixed device available memory 268 when at least some of the one or more memory devices associated with the fixed device memory 268 are available for storage access. The computing device 320 includes a dispersed storage (DS) module 322 and may include one or more of the mobile device memory 266 and the fixed device memory 268. The DS module 322 functions to set up the LAN 262 and WAN 264 and includes a determine LAN memories module 324, an establish parameters module 326, a determine LAN pillar width module 328, and a determine WAN pillar width module 330.

The determine LAN memories module 324, when operable within the computing device 320, causes the computing device 320 to determine LAN available memories of the LAN 262 environment. The determine LAN memories module 324 functions to determine the LAN available memories by identifying one or more mobile device available memories 266 and identifying one or more fixed device available memories 268. For example, the determine LAN memories module 324 sends an availability request 332 to one or more mobile device memories 266 and one or more fixed device memories 268 and receives availability responses 334 which identifies LAN available memories.

The establish parameters module 326, when operable within the computing device 320, causes the computing device 320 to establish a decode threshold parameter 336 and a pillar width parameter 338 of a dispersed storage error coding function based on quantities of the LAN available memories. The establish parameters module 326 functions to establish the decode threshold parameter 336 and the pillar width parameter 338 by determining the decode threshold parameter 336 based on a minimum quantity of the fixed device available memory and determining the pillar width parameter 338 based on the minimum quantity of the fixed device available memory and a minimum quantity of the mobile device available memory. For example, the establish parameters module 326 establishes a decode threshold parameter 336 to be 10 and a pillar width parameter 338 to be 16 when a minimum quantity of the fixed device available memory is 10, eight mobile device memories 266 are available, and 12 fixed device memories 268 are available.

The determine LAN pillar width module 328, when operable within the computing device 320, causes the computing device 320 to determine a LAN pillar width value 340 based on the decode threshold parameter 336, the pillar width parameter 338, and the quantities of the LAN available memories, wherein the LAN pillar width value 340 is equal to or greater than a value of the decode threshold parameter 336. The determine LAN pillar width module 328 is further operable to determine the LAN pillar width value 340 to be less than a value of the pillar width parameter 338. For example, the determine LAN pillar width module 328 determines a LAN pillar width value 340 to be 12 when the decode threshold parameter 336 is 10, the pillar width parameter 338 is 16, and there are greater than 12 LAN available memories.

The determine WAN pillar width module 330, when operable within the computing device 320, causes the computing device 320 to determine a WAN pillar width value 342 based on the decode threshold parameter 336 and the pillar width parameter 338, wherein the WAN pillar width value 342 is equal to or greater than the value of the decode threshold parameter 336, wherein, for data that is encoded into a set of encoded data slices in accordance with the dispersed storage error coding function, the decode threshold parameter 336, and the pillar width parameter 338, a LAN pillar width value 340 of encoded data slices of the set of encoded data slices are selected for storage in the LAN available memories, and a WAN pillar width value 342 of encoded data slices of the set of encode data slices for storage in the DSN memory 22 of the WAN 264. The determine WAN pillar width module 330 is further operable to determine the WAN pillar width value 342 to be less than the value of the pillar width parameter 338. For example, the determine WAN pillar width module 330 determines a WAN pillar width value 342 to be 11 when the decode threshold parameter 336 is 10 and the pillar width parameter 338 is 16.

Figure 10D:
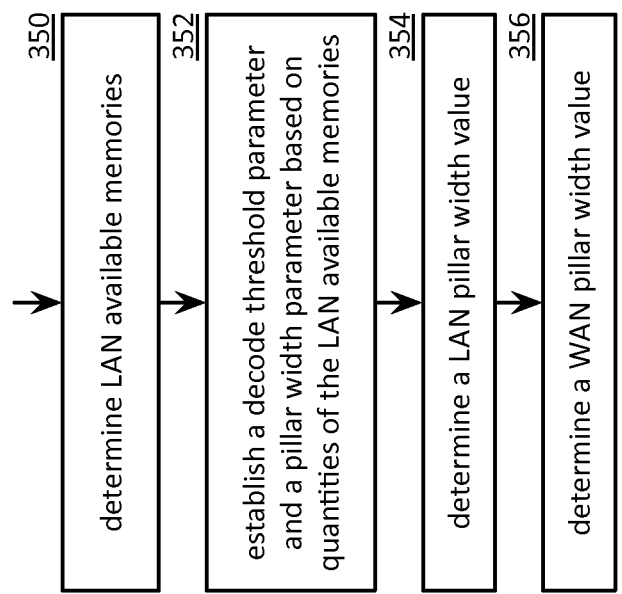
FIG. 10D is a flowchart illustrating an example of setting up a dispersed storage in accordance with the present invention.

FIG. 10D is a flowchart illustrating an example of setting up a dispersed storage system. The method begins at step 350 where a processing module (e.g., of a computing device) determines LAN available memories of a local area network (LAN) environment. The determining LAN available memories includes identifying one or more mobile device available memories and identifying one or more fixed device available memories. The method continues at step 352 where the processing module establishes a decode threshold parameter and a pillar width parameter of a dispersed storage error coding function based on quantities of the LAN available memories. The establishing the decode threshold parameter and the pillar width parameter includes determining the decode threshold parameter based on a minimum quantity of the fixed device available memory and determining the pillar width parameter based on the minimum quantity of the fixed device available memory and a minimum quantity of the mobile device available memory.

The method continues at step 354 where the processing module determines a LAN pillar width value based on the decode threshold parameter, the pillar width parameter, and the quantities of the LAN available memories, wherein the LAN pillar width value is equal to or greater than a value of the decode threshold parameter. Alternatively, the processing module determines the LAN pillar width value to be less than a value of the pillar width parameter. The method continues at step 356 where the processing module determines a WAN pillar width value based on the decode threshold parameter and the pillar width parameter, wherein the WAN pillar width value is equal to or greater than the value of the decode threshold parameter, wherein, for data that is encoded into a set of encoded data slices in accordance with the dispersed storage error coding function, the decode threshold parameter, and the pillar width parameter, a LAN pillar width value of encoded data slices of the set of encoded data slices are selected for storage in the LAN available memories, and a WAN pillar width value of encoded data slices of the set of encode data slices for storage in a distributed storage network (DSN) memory of the WAN. Alternatively, the processing module determines the WAN pillar width value to be less than the value of the pillar width parameter.

Figure 11:
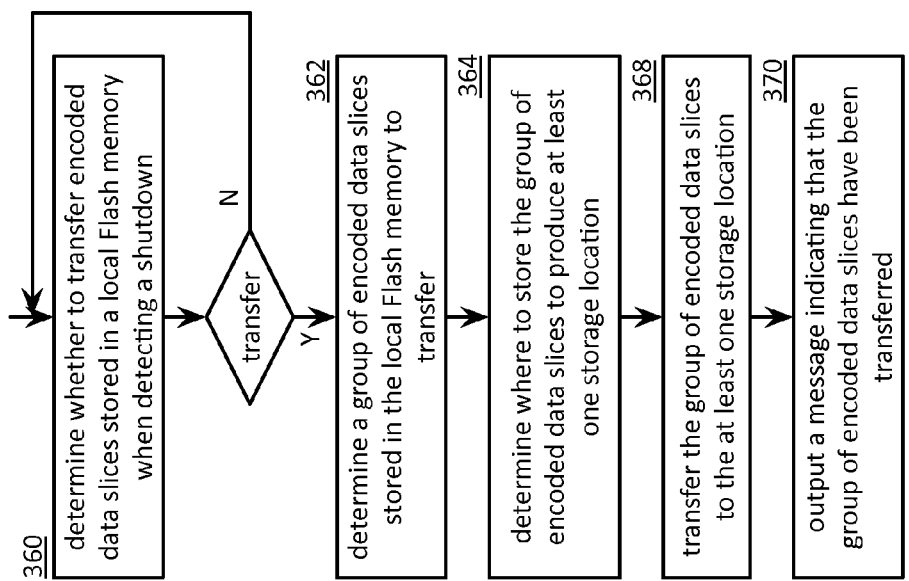
FIG. 11 is a flowchart illustrating an example of transferring data in accordance with the present invention.

FIG. 11 is a flowchart illustrating an example of transferring data. The method begins with step 360 where a processing module determines whether to transfer encoded data slices stored in a local Flash memory when detecting a shutdown. The detecting a shutdown includes or more of receiving a shutdown message, detecting a power failure, detecting a processing failure, executing a query, receiving a message, receiving a command, receiving a request, looking up a pre-determination, and looking up a schedule. The determination may be based on one or more of a storage requirement, a storage indicator, a memory type indicator, a slice priority indicator, a data type indicator, a user identifier (ID), a vault ID, a slice volume indicator, an estimated time to transfer slices, and an estimated time to power off. For example, the processing module determines to transfer the encoded data slices when a slice priority indicator associated with the encoded data slices compares favorably to a slice priority threshold, and the estimated time to transfer slices compares favorably to the estimated time to power off. The method loops at step 360 when the processing module determines not to transfer the encoded data slices. The method continues to step 362 when the processing module determines to transfer the encoded data slices.

The method continues at step 362 where the processing module determines a group of encoded data slices stored in the local flash memory to transfer. The group of encoded data slices may include at least a decode threshold number of encoded data slices per set of encoded data slices. The determination may be based on one or more of error coding dispersal storage function parameters, the storage requirement, the storage indicator, the memory type indicator, the slice priority indicator, the data type indicator, the user ID, the vault ID, the slice volume indicator, the estimated time to transfer slices, and the estimated time to power off. For example, the processing module determines the group of encoded data slices to include 12 encoded data slices per set of encoded data slices when the error coding dispersal storage option parameters includes a read threshold of 12 and a decode threshold of 10.

The method continues at step 364 where the processing module determines where to store the group of encoded data slices to produce at least one storage location. The storage location may include one or more other user devices, wherein the one or more other user devices are affiliated with a current user device such that each of the other user devices is associated with a storage indicator indicating a favorable level of Flash memory capacity sufficient to store the group of encoded data slices. The determination may be based on one or more of an alternative memory list, a query, a message, a size of the group of encoded data slices, a predetermination, a lookup, a request, a command, and a message.

The method continues at step 368 where the processing module transfers the group of encoded data slices to the at least one storage location. The transferring may include retrieving the group of encoded data slices and outputting the group of encoded data slices to the lease one storage location. The method continues at step 370 where the process module outputs a message indicating that the group of encoded data slices has been transferred. The outputting may include sending the message to one or more of another user device, a dispersed storage (DS) processing unit, and a DS managing unit. The processing module may receive a subsequent shutdown message in response to sending the message. Next, the processing module completes a final shutdown process when receiving a shutdown message.

Figures 12A, 12B:
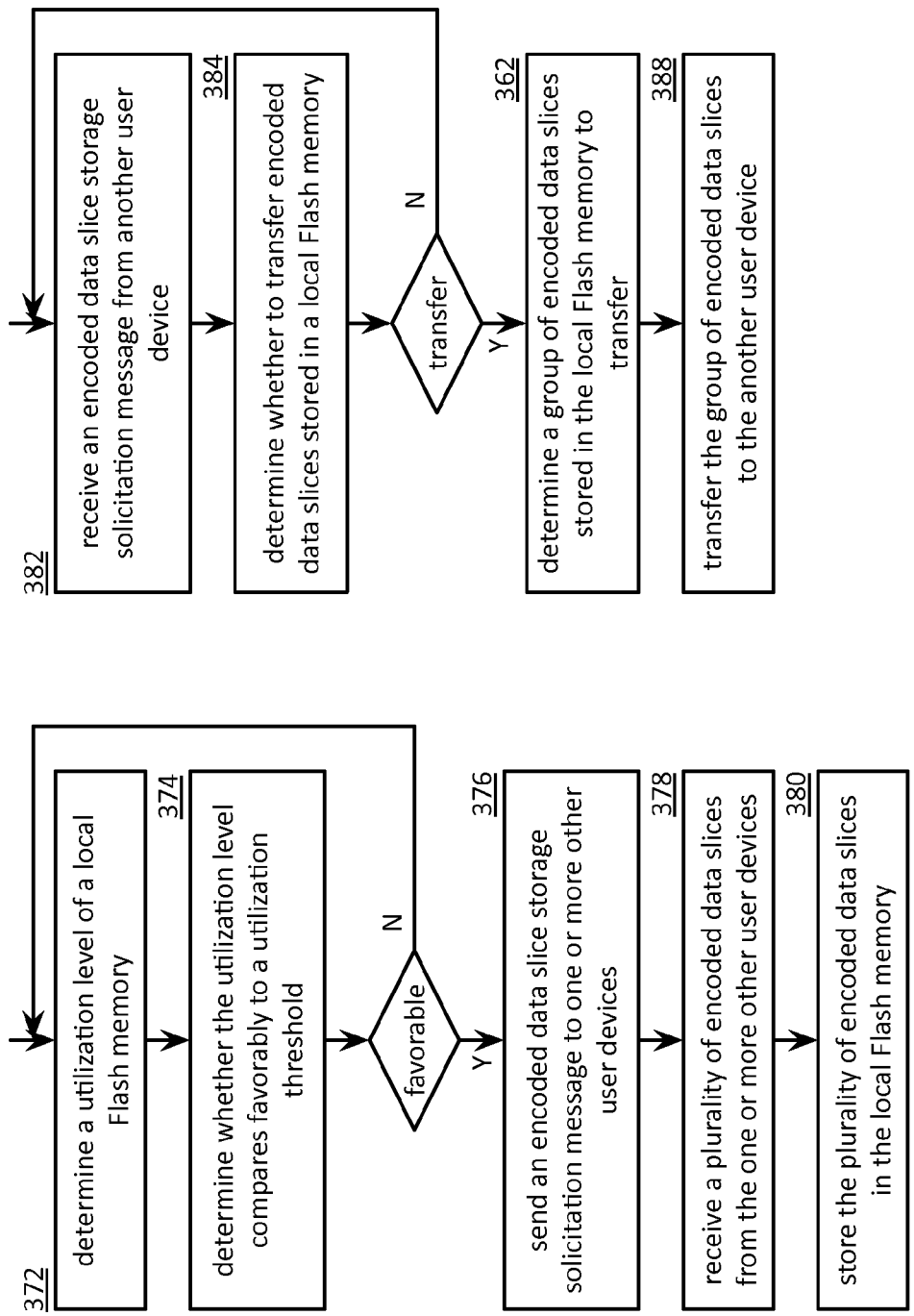
FIG. 12A is a flowchart illustrating an example of generating an encoded data slice storage solicitation message in accordance with the present invention.
FIG. 12B is a flowchart illustrating an example of processing an encoded data slice storage solicitation message in accordance with the present invention.

FIG. 12A is a flowchart illustrating an example of generating an encoded data slice storage solicitation message. The method begins with step 372 where a processing module determines a utilization level of a local flash memory. The method continues at step 374 where the processing module determines whether the utilization level compares favorably to a utilization threshold. For example, the processing module determines that the utilization level compares favorably to the utilization threshold when the utilization level is less than the utilization threshold. The method branches to step 376 when the processing module determines that the utilization level compares favorably to the utilization threshold. The method loops back to step 372 when the processing module determines that the utilization level does not compare favorably to the utilization threshold (e.g., no storage capacity to share).

The method continues at step 376 where the processing module generates and sends an encoded data slice storage solicitation message to one or more other user devices. The solicitation message includes one or more of an available amount of memory indicator, a user device identifier (ID), a performance history indicator, a group ID, a vault ID, and a one-time/on-going indicator (e.g., one-time: transfer now only; on-going: transfer now and for subsequent transfer and storage operations). The sending includes outputting the data slice storage slice solicitation message to one or more of a random user device, an affiliated user device, a group of affiliated user devices, one or more other user devices that previously output a request for stories message, and a list of targets. The method continues step 378 where the processing module receives a plurality of encoded data slices from the one or more other user devices. The method continues at step 380 where the processing module stores the plurality of encoded data slices in the local flash memory. The method may repeat back to step 372.

FIG. 12B is a flowchart illustrating an example of processing an encoded data slice storage solicitation message that includes similar steps to FIG. 11. The method begins at step 382 where a processing module receives an encoded data slice storage solicitation message from another user device. The method continues at step 384 where the processing module determines whether to transfer encoded data slices that are stored in a local Flash memory. The determination may be based on one or more of the storage requirement, a storage indicator, a utilization level indicator, a utilization level threshold, a permissions list, an affiliation list, information in the solicitation message, a predetermination, a lookup, a message, a request, and a command. For example, the processing module determines to transfer encoded data slices when a user identifier (ID) associated with the solicitation message compares favorably to the permissions list and the utilization level indicator compares unfavorably to the utilization level threshold. The method loops back to step 382 when the processing module determines not to transfer encoded data slices. The method continues to step 362 of FIG. 11 when the processing module determines to transfer encoded data slices.

The method continues with step 362 of FIG. 11 where the processing module determines a group of encoded data slices stored in the local Flash memory to transfer. The method continues at step 388 where the processing module transfers the group of encoded data slices to the other user device. The transferring includes retrieving the group of encoded data slices from the local flash memory and outputting the group of encoded data slices to the other user device.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module", "processing circuit", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The present invention has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The present invention may have also been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of the various embodiments of the present invention. A module includes a processing module, a functional block, hardware, and/or software stored on memory for performing one or more functions as may be described herein. Note that, if the module is implemented via hardware, the hardware may operate independently and/or in conjunction software and/or firmware. As used herein, a module may contain one or more sub-modules, each of which may be one or more modules.

While particular combinations of various functions and features of the present invention have been expressly described herein, other combinations of these features and functions are likewise possible. The present invention is not limited by the particular examples disclosed herein and expressly incorporates these other combinations.

What is claimed is:

1. A method comprises:
   storing data files utilizing a dispersed storage error coding function, wherein a data file of the data files is encoded using the dispersed storage error coding function to produce a plurality of sets of encoded data slices, wherein the plurality of sets of encoded data slices is stored in memory, and wherein the dispersed storage error coding function includes a pillar width parameter and a decode threshold parameter, where the pillar width parameter is at least 1.8 times the decode threshold parameter;
   determining whether to adjust the pillar width parameter based one or more memory performance characteristics; and
   when the pillar width parameter is to be decreased:
      identifying one or more pillars within the memory to delete to produce one or more identified pillars;
      identifying encoded data slices of one or more of the data files stored in the one or more identified pillars to produce identified encoded data slices; and
      deleting the identified encoded data slices.

2. The method of claim 1, wherein determining to decrease the pillar width parameter comprises:
   determining a memory utilization indicator associated with the memory;
   determining a memory reliability indicator associated with the memory; and
   when the memory utilization indicator is unfavorable and the memory reliability indicator is favorable, indicating a decrease of the pillar width parameter.

3. The method of claim 1, wherein the identifying one or more pillars within the memory to delete comprises:
   determining an amount of memory space to reclaim based on at least one of: a memory utilization indicator and a memory reliability indicator;
   identifying one or more of the data files based on data file criteria; and
   determining a number of pillars to be deleted based on the amount of memory space to reclaim and the identified one or more of the data files.

4. The method of claim 1, wherein the deleting the identified encoded data slices comprises:
   reclaiming memory space of the deleted encoded data slices to produce reclaimed memory space; and
   updating pillar mapping of the memory in accordance with the decreasing of the pillar width parameter and the reclaimed memory space.

5. The method of claim 1, wherein the identifying encoded data slices comprises:
   identifying the one or more of the data files; and
   for each of the one or more identified data files:
      determining which of the encoded data slices of a respective plurality of sets of encoded data slices are stored in the one or more identified pillars to produce data file specific encoded data slices, wherein the identified encoded data slices includes the data file specific encoded data slices for each of the one or more identified data files.

6. The method of claim 1, wherein the memory comprises one or more of:
   a local memory; and
   a dispersed storage network (DSN) memory.

7. The method of claim 1 further comprises:
   encoding a subsequent data file utilizing the decreasing of the pillar width parameter, the decode threshold parameter, and the dispersed storage error coding function to produce a subsequent plurality of sets of encoded data slices; and
   storing the subsequent plurality of sets of encoded data slices in the memory.

8. A method comprises:
   storing data files utilizing a dispersed storage error coding function, wherein a data file of the data files is encoded using the dispersed storage error coding function to produce a plurality of sets of encoded data slices, wherein the plurality of sets of encoded data slices is stored in memory, and wherein the dispersed storage error coding function includes a pillar width parameter and a decode threshold parameter, where the pillar width parameter is greater than the decode threshold parameter;
   determining whether to adjust the pillar width parameter based one or more memory performance characteristics; and when the pillar width parameter is to be increased:
   determining a number of additional pillars to produce an increased pillar width parameter;
   identifying one or more of the data files based on data file criteria; and
   for each of the one or more data files:
      encoding a data file of the one or more data files utilizing the increased pillar width parameter, the decode threshold parameter, and the dispersed storage error coding function to produce a plurality of subsets of encoded data slices relating to the number of additional pillars; and
      storing the plurality of subsets of encoded data slices in the memory corresponding to the additional pillars.

9. The method of claim 8 further comprises:
the determining to increase the pillar width parameter including:
   determining a memory utilization indicator associated with the memory;
   determining a memory reliability indicator associated with the memory; and
   when the memory utilization indicator is favorable and the memory reliability indicator is unfavorable, indicating an increase of the pillar width parameter; and
the determining the number of additional pillars including:
   determining a level of unfavorability of the memory reliability indicator; and
   determining the number of additional pillars based on the level of unfavorability.

10. The method of claim 8, wherein the storing the plurality of subsets of encoded data slices comprises:
   updating pillar mapping of the memory in accordance with the increasing of the pillar width parameter.

11. The method of claim 8, wherein the memory comprises one or more of:
   a local memory; and
   a dispersed storage network (DSN) memory.

12. The method of claim 8 further comprises:
   encoding a subsequent data file utilizing the increased pillar width parameter, the decode threshold parameter, and the dispersed storage error coding function to produce a subsequent plurality of sets of encoded data slices; and
   storing the subsequent plurality of sets of encoded data slices in the memory.

13. A dispersed storage (DS) module comprises:
   a first module, when operable within a computing device, causes the computing device to:
      store data files utilizing a dispersed storage error coding function, wherein a data file of the data files is encoded using the dispersed storage error coding function to produce a plurality of sets of encoded data slices, wherein the plurality of sets of encoded data slices is stored in memory, and wherein the dispersed storage error coding function includes a pillar width parameter and a decode threshold parameter, where the pillar width parameter is at least 1.8 times the decode threshold parameter;
   a second module, when operable within the computing device, causes the computing device to:
      determine whether to adjust the pillar width parameter based one or more memory performance characteristics; and
   when the pillar width parameter is to be decreased, a third module, when operable within the computing device, causes the computing device to:
      identify one or more pillars within the memory to delete to produce one or more identified pillars;
      identify encoded data slices of one or more of the data files stored in the one or more identified pillars to produce identified encoded data slices; and
      delete the identified encoded data slices.

14. The DS module of claim 13, wherein the second module functions to determine to decrease the pillar width parameter by:
   determining a memory utilization indicator associated with the memory;
   determining a memory reliability indicator associated with the memory; and
   when the memory utilization indicator is unfavorable and the memory reliability indicator is favorable, indicating a decrease of the pillar width parameter.

15. The DS module of claim 13, wherein the third module functions to identify the one or more pillars within the memory to delete by:
   determining an amount of memory space to reclaim based on at least one of: a memory utilization indicator and a memory reliability indicator;
   identifying one or more of the data files based on data file criteria; and
   determining a number of pillars to be deleted based on the amount of memory space to reclaim and the identified one or more of the data files.

16. The DS module of claim 13, wherein the third module functions to delete the identified encoded data slices by:
   reclaiming memory space of the deleted encoded data slices; and
   updating pillar mapping of the memory in accordance with the decreasing of the pillar width parameter and the reclaimed memory space.

17. The DS module of claim 13, wherein the third module functions to identify the encoded data slices by:
   identifying the one or more of the data files; and
   for each of the one or more identified data files:
      determining which of the encoded data slices of a respective plurality of sets of encoded data slices are stored in the one or more identified pillars to produce data file specific encoded data slices, wherein the identified encoded data slices includes the data file specific encoded data slices for each of the one or more identified data files.

18. The DS module of claim 13, wherein the memory comprises one or more of:
   a local memory; and
   a dispersed storage network (DSN) memory.

19. The DS module of claim 13 further comprises:
the first module, when operable within the computing device, further causes the computing device to:
   encode a subsequent data file utilizing the decreased pillar width parameter, the decode threshold parameter, and the dispersed storage error coding function to produce a subsequent plurality of sets of encoded data slices; and
   store the subsequent plurality of sets of encoded data slices in the memory.

20. A dispersed storage (DS) module comprises:
   a first module, when operable within a computing device, causes the computing device to:
      store data files utilizing a dispersed storage error coding function, wherein a data file of the data files is encoded using the dispersed storage error coding function to produce a plurality of sets of encoded data slices, wherein the plurality of sets of encoded data slices is stored in memory, and wherein the dispersed storage error coding function includes a pillar width parameter and a decode threshold parameter, where the pillar width parameter is greater than the decode threshold parameter;
a second module, when operable within the computing device, causes the computing device to:
  determine whether to adjust the pillar width parameter based one or more memory performance characteristics; and
when the pillar width parameter is to be increased, a third module, when operable within the computing device, causes the computing device to:
  determine a number of additional pillars to produce an increased pillar width parameter;
  identify one or more of the data files based on data file criteria; and
  for each of the one or more data files:
    encode a data file of the one or more data files utilizing the increased pillar width parameter, the decode threshold parameter, and the dispersed storage error coding function to produce a plurality of subsets of encoded data slices relating to the number of additional pillars; and
    store the plurality of subsets of encoded data slices in the memory corresponding to the additional pillars.

21. The DS module of claim 20 further comprises:
the second module, when operable within the computing device, further causes the computing device to determine to increase the pillar width parameter by one or more of:
  determining a memory utilization indicator associated with the memory;
  determining a memory reliability indicator associated with the memory; and
  when the memory utilization indicator is favorable and the memory reliability indicator is unfavorable, indicating an increase of the pillar width parameter; and
the third module, when operable within the computing device, further causes the computing device to determine the number of additional pillars by one or more of:
  determining a level of unfavorability of the memory reliability indicator; and
  determining the number of additional pillars based on the level of unfavorability.

22. The DS module of claim 20, wherein the third module further functions to store the plurality of subsets of encoded data slices by:
  updating pillar mapping of the memory in accordance with the increasing of the pillar width parameter.

23. The DS module of claim 20, wherein the memory comprises one or more of:
  a local memory; and
  a dispersed storage network (DSN) memory.

24. The DS module of claim 20 further comprises:
the first module, when operable within the computing device, further causes the computing device to:
  encode a subsequent data file utilizing the increased pillar width parameter, the decode threshold parameter, and the dispersed storage error coding function to produce a subsequent plurality of sets of encoded data slices; and
  store the subsequent plurality of sets of encoded data slices in the memory.

* * * * *